(12) United States Patent
Fujita et al.

(10) Patent No.: US 8,106,893 B2
(45) Date of Patent: Jan. 31, 2012

(54) SENSING APPARATUS AND METHOD, AND PROGRAM THEREFOR

(75) Inventors: Hiroyuki Fujita, Otsu (JP); Masahiro Kinoshita, Kyoto (JP); Takeshi Horiuchi, Sanda (JP); Teppei Sumino, Otsu (JP); Seiichi Kurosawa, Higashiomi (JP)

(73) Assignee: OMRON Corporation, Kyoto (JP)

( * ) Notice: Subject to any disclaimer, the term of this patent is extended or adjusted under 35 U.S.C. 154(b) by 721 days.

(21) Appl. No.: 12/206,409

(22) Filed: Sep. 8, 2008

(65) Prior Publication Data

US 2009/0073140 A1 Mar. 19, 2009

(30) Foreign Application Priority Data

Sep. 14, 2007 (JP) .................................. 2007-239844

(51) Int. Cl.
*G06F 3/041* (2006.01)
*G01R 27/26* (2006.01)
*G01D 18/00* (2006.01)

(52) U.S. Cl. ........... 345/178; 324/686; 324/658; 702/85

(58) Field of Classification Search .................. 324/658, 324/669; 345/173
See application file for complete search history.

(56) References Cited

U.S. PATENT DOCUMENTS

| | | | | |
|---|---|---|---|---|
| 3,564,581 A * | 2/1971 | Winterburn et al. | ......... | 123/598 |
| 4,039,940 A * | 8/1977 | Butler et al. | .................. | 324/678 |
| 5,933,102 A * | 8/1999 | Miller et al. | .................... | 341/33 |
| 6,456,952 B1 * | 9/2002 | Nathan | ........................... | 702/94 |
| 6,661,239 B1 * | 12/2003 | Ozick | ........................... | 324/658 |
| 6,940,291 B1 * | 9/2005 | Ozick | ........................... | 324/658 |
| 7,205,776 B2 * | 4/2007 | Kinoshita et al. | ............. | 324/658 |
| 7,504,833 B1 * | 3/2009 | Seguine | ....................... | 324/672 |
| 7,567,240 B2 * | 7/2009 | Peterson et al. | .............. | 345/173 |
| 7,692,639 B2 * | 4/2010 | Silverstein et al. | ........... | 345/179 |
| 2007/0176609 A1 * | 8/2007 | Ely et al. | ....................... | 324/678 |
| 2008/0088323 A1 * | 4/2008 | Vornsand et al. | .............. | 324/686 |
| 2008/0158182 A1 * | 7/2008 | Westerman | ................... | 345/173 |

FOREIGN PATENT DOCUMENTS

| | | |
|---|---|---|
| JP | 06-162888 A | 6/1994 |
| JP | 2007-141541 A | 6/2007 |

* cited by examiner

*Primary Examiner* — Alexander S Beck
*Assistant Examiner* — Mihir Rayan
(74) *Attorney, Agent, or Firm* — Osha • Liang LLP

(57) ABSTRACT

Human contact/non-contact is detected speedily and accurately. A measurement section measures capacitance of each of sites to which a plurality of electrodes are connected where a human body touches, a comparison section compares the capacitance with a threshold value for each contacting electrode, and a control section determines whether a human body has come in contact based on the comparison result. A reference value calculation section calculates a reference value serving as electrode-specific reference capacitance based on the measurement results corresponding to the plurality of electrodes cumulatively stored in a storage section, a difference calculation section calculates an absolute difference value between the electrode-specific reference capacitance and a plurality of measurement results, and a threshold value adjustment section adjusts the threshold value by subtracting from the electrode-specific threshold value a value of the sum of the calculated absolute difference value for each of the electrodes other than the absolute difference value of each of the electrodes. The present invention can be applied to a touch sensor.

11 Claims, 28 Drawing Sheets

Fig. 6

|  | SW1 | SW2 | SW3 |
|---|---|---|---|
| First step | ON | ON/OFF | ON/OFF |
| Second step | OFF | OFF | OFF |
| Third step | OFF | ON | ON |
| Fourth step | OFF | OFF | OFF |
| Fifth step | OFF | OFF | OFF |

Fig. 17

|  | SW1 | SW2 | SW3 |
|---|---|---|---|
| First step | ON | OFF | ON/OFF |
| Second step | OFF | OFF | OFF |
| Third step | OFF | ON | ON |
| Fourth step | OFF | OFF | OFF |
| Fifth step | OFF | OFF | OFF |

SENSING APPARATUS AND METHOD, AND PROGRAM THEREFOR

BACKGROUND OF THE INVENTION

1. Field of the Invention

The present invention relates to a sensing apparatus and method, and a program therefor, and more particularly to a sensing apparatus and method, and a program therefor that are capable of sensing contact/non-contact of a human body at high speeds and with high accuracy.

2. Description of the Related Art

A touch sensor is generally spreading which senses contact or non-contact of a human body based on a change in capacitance of an electrode and the like.

The touch sensor senses contact or non-contact of a human body by detecting capacitance of an electrode section that provides a contact portion and determining whether the detected capacitance is that of the human body. The touch sensor has been used in, for example, an elevator operation button or a ball launcher of a pachinko game machine.

However, the touch sensor may sometimes operate erroneously when touched by something other than a human being. To solve this problem, a method has been proposed to prevent the touch sensor from operating erroneously.

For example, if a touch key including an electrode is held down for more than a predetermined period of time or if an average value of output variations is not larger than a ratio at the time of maximum variation, a proposed constitution determines that it is not a key operation performed by a human with his/her finger and in such a case, cancels the receiving operation (see, e.g., Japanese Patent Application Laid-Open No. 2007-141541).

According to another proposal, a plurality of sensing electrodes are disposed around a main sensing element of a non-contact type switch, whereby when a signal occurs which senses contact of a human body on the main sensing electrode and when detection signals corresponding to the peripheral electrodes are also generated within a predetermined period of time after the moment of the occurrence, no output signal is generated (see Japanese Patent Application Laid-Open No. 06-162888).

However, in the case of the approach of Japanese Patent Application Laid-Open No. 2007-141541, the output signal may occur if a plurality of switches are pressed by the palm of a hand or if metal approaches the apparatus temporarily.

On the other hand, in the case of the approach of Japanese Patent Application Laid-Open No. 06-162888, a predetermined period of time must be awaited to pass after contact or non-contact of the main sensing element is detected, so that the response speed may be affected.

SUMMARY OF THE INVENTION

The present invention was made in view of the above circumstances, and it is an object of the present invention to enable speedy determination of contact or non-contact of a human body with high accuracy based on capacitance especially by adjusting a threshold value of capacitance which is used to determine whether contact is sensed based on a change in capacitance of a plurality of electrodes.

A sensing apparatus according to one aspect of the present invention includes a measurement section that measures capacitance of each of a plurality of first electric capacitors having unknown capacitance, a plurality of contact sections that are electrically connected to the plurality of first electric capacitors and that a human body disposed proximally contacts directly or indirectly through an insulator, a determination section that determines whether the human body has contacted the contact section either directly or indirectly based on a result of comparison between the capacitance of the plurality of first electric capacitors measured by the measurement section and a threshold value for each of the plurality of first electric capacitors, a storage section that cumulatively stores a result of measurement for each of the plurality of first electric capacitors, the result of measurement being the result of measurement by the measurement section, a reference capacitance calculation section that calculates reference capacitance for each of the plurality of first electric capacitors based on the result of measurement stored in the storage section, a difference calculation section that calculates an absolute difference value between the reference capacitance for each of the plurality of first electric capacitors and the result of measurement measured by the measurement section for each of the plurality of first electric capacitors, and an adjustment section that adjusts the threshold value for each of the plurality of first electric capacitors based on a sum of the absolute difference value calculated by the difference calculation section for each of the first electric capacitors other than the absolute difference value of each of the first electric capacitors.

The sensing apparatus can further include a third electric capacitor whose first end is connected to a second end of a circuit whose first end is grounded and which connects in series a second electric capacitor having known capacitance with the first electric capacitors and whose second end is grounded, to apply a charging voltage of the third electric capacitor itself to the second end of the circuit, so as to charge the first electric capacitors and a plurality of second electric capacitors identical to the second electric capacitor having the known capacitance and respectively corresponding to the first electric capacitors, a first discharge section that discharges the third electric capacitor partly and the second electric capacitor totally, a second discharge section that discharges the first electric capacitors totally at substantially the same timing as the first discharge section, a counter section that measures the number of times of discharging by the first discharge section and the second discharge section, and a comparison section that compares a charging voltage for the first electric capacitors and a reference voltage, wherein in a case where discharging is repeated by the first and second discharge sections and when a result of comparison by the comparison section indicates that the charging voltage for the first electric capacitors agrees with the reference voltage or smaller than the reference voltage, the measurement section can calculate the capacitance of the first electric capacitors based on the current number of times of discharging measured by the counter section, thereby measuring the capacitance of the first electric capacitors.

The first discharge section can discharge the third electric capacitor which has been charged for a predetermined time through a resistor connected in series with the third electric capacitor, to discharge the third electric capacitor partly.

A charge section that charges the third electric capacitor at a predetermined charging voltage can be further provided, wherein the charge section can charge the third electric capacitor directly.

A charge section that charges the third electric capacitor at a predetermined charging voltage can be further provided, wherein the first discharge section has a first end thereof grounded and a second end thereof connected between the circuit and the resistor, and the charge section can charge the third electric capacitor from the same position as the second end of the first discharge section.

A diode can be provided in parallel with the resistor and in a forward direction toward the third electric capacitor.

A switch section can be further provided which switches one of the second electric capacitors having the known capacitance and the plurality of first electric capacitors to connect them in series.

The second electric capacitor can further include an electrode, and the electrode is capable of being contacted by a human body directly or indirectly through an insulator.

The adjustment section can adjust the threshold value by subtracting from the threshold value for each of the first electric capacitors a value of the sum of the absolute difference value calculated by the difference calculation section for each of the plurality of first electric capacitors other than the absolute difference value of each of the first electric capacitors.

A sensing method according to one aspect of the present invention includes a measurement step of measuring capacitance of each of a plurality of first electric capacitors having unknown capacitance, a determination step of determining whether a human body has contacted a contact section either directly or indirectly based on a result of comparison between the capacitance of the plurality of first electric capacitors measured by a measurement section and a threshold value for each of the plurality of first electric capacitors, a storage step of cumulatively storing a result of measurement for each of the plurality of first electric capacitors, the result of measurement being the result of measurement through processing of the measurement step, a reference capacitance calculation step of calculating reference capacitance for each of the plurality of first electric capacitors based on the result of measurement stored through processing of the storage step, a difference calculation step of calculating an absolute difference value between the reference capacitance for each of the plurality of first electric capacitors and the result of measurement measured through processing of the measurement step for each of the plurality of first electric capacitors, and an adjustment step of adjusting the threshold value for each of the plurality of first electric capacitors based on a sum of the absolute difference value calculated through processing of the difference calculation step for each of the first electric capacitors other than the absolute difference value of each of the first electric capacitors.

A program according to one aspect of the present invention that causes a computer to perform processing includes a measurement step of measuring capacitance of each of a plurality of first electric capacitors having unknown capacitance, a determination step of determining whether a human body has contacted a contact section either directly or indirectly based on a result of comparison between the capacitance of the plurality of first electric capacitors measured by a measurement section and a threshold value for each of the plurality of first electric capacitors, a storage step of cumulatively storing a result of measurement for each of the plurality of first electric capacitors, the result of measurement being the result of measurement through processing of the measurement step, a reference capacitance calculation step of calculating reference capacitance for each of the plurality of first electric capacitors based on the result of measurement stored through processing of the storage step, a difference calculation step of calculating an absolute difference value between the reference capacitance for each of the plurality of first electric capacitors and the result of measurement measured through processing of the measurement step for each of the plurality of first electric capacitors, and an adjustment step of adjusting the threshold value for each of the plurality of first electric capacitors based on a sum of the absolute difference value calculated through processing of the difference calculation step for each of the first electric capacitors other than the absolute difference value of each of the first electric capacitors.

In a sensing apparatus and method, and a program therefor according to one aspect of the present invention, the capacitance of each of a plurality of first electric capacitors having unknown capacitance is measured, a human body disposed proximally is contacted directly or indirectly through an insulator, it is determined whether the human body has come in contact either directly or indirectly based on a result of comparison between the measured capacitance of the plurality of first electric capacitors and a threshold value for each of the plurality of first electric capacitors, a result of measurement for each of the plurality of first electric capacitors, which is the measured result of measurement, is cumulatively stored, reference capacitance for each of the plurality of first electric capacitors based on the stored result of measurement is calculated, an absolute difference value between the reference capacitance for each of the plurality of first electric capacitors and the measured result of measurement for each of the plurality of first electric capacitors is calculated, and the threshold value for each of the plurality of first electric capacitors is adjusted based on a sum of the calculated absolute difference value for each of the first electric capacitors other than the absolute difference value of each of the first electric capacitors.

In the sensing apparatus according to the present invention, a plurality of first electric capacitors having unknown capacitance may be, for example, a plurality of capacitors having unknown capacitance, a measurement section that measures the capacitance of those capacitors may be, for example, a measurement section, the plurality of contact sections that are electrically connected to the plurality of first electric capacitors and that a human body disposed proximally contacts directly or indirectly through an insulator may be, for example, a plurality of electrodes, a determination section that determines whether the human body has contacted the contact section either directly or indirectly based on a result of comparison between the capacitance of the plurality of first electric capacitors measured by the measurement section and a threshold value for each of the plurality of first electric capacitors may be, for example, a control section, a storage section that cumulatively stores a result of measurement for each of the plurality of first electric capacitors, which is the result of measurement by the measurement section may be, for example, a storage section, a reference capacitance calculation section that calculates reference capacitance for each of the plurality of first electric capacitors based on the result of measurement stored in the storage section may be, for example, a reference calculation section, a difference calculation section that calculates an absolute difference value between the reference capacitance for each of the plurality of first electric capacitors and the result of measurement for each of the plurality of first electric capacitors measured by the measurement section may be, for example, a difference calculation section, and an adjustment section that adjusts the threshold value for each of the plurality of first electric capacitors based on a sum of the absolute difference value for each of the first electric capacitors calculated by the difference calculation section other than the absolute difference value of each of the first electric capacitors may be, for example, a threshold value adjustment section.

That is, the electrostatic capacitance of a site connected to electrodes, which are a plurality of electrodes which the human body contacts, is measured and compared with a predetermined threshold value, thereby detecting presence of human body contact. In this case, a reference value is obtained from a plurality of immediately previous measurement results for each of the electrodes to obtain an absolute difference value with respect to the most recent measurement result, thereby obtaining a change in electrostatic capacitance. Further, a threshold value which is set for each of the electrodes is subtracted by a sum of the absolute difference values except the absolute difference value of its own electrode to adjust the threshold value, so that if the electrostatic capacitance changes in a condition where more than one electrodes are contacted, a condition difficult to sense contact is brought about, thereby reducing erroneous detection.

According to the present invention, it is possible to speedily sense contact/non-contact of a human body with high accuracy.

BRIEF DESCRIPTION OF THE DRAWINGS

FIG. 6 shows an explanatory table of the measurement processing by the touch sensor of FIG. 1;

FIG. 17 shows an explanatory table of the measurement processing by the touch sensor of FIG. 14;

DETAILED DESCRIPTION OF THE PREFERRED EMBODIMENTS

Figure 1:
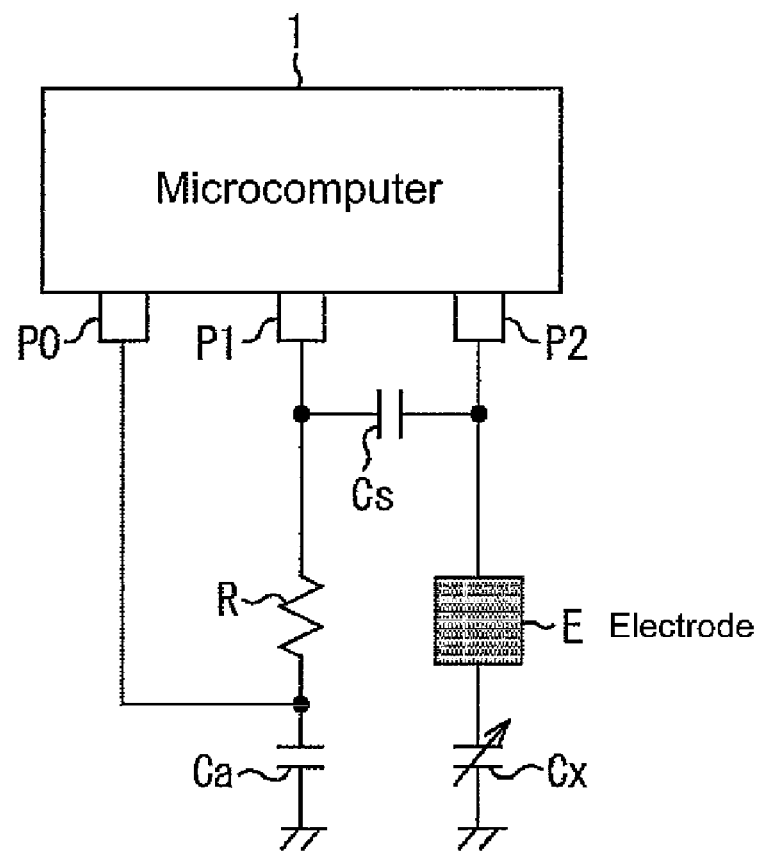
FIG. 1 shows an explanatory diagram of a constitution of one embodiment of a touch sensor to which the present invention is applied.

In the following description of embodiments of the present invention, a correlation between the aspects of the invention described in the present specification and the embodiments is exemplified as follows. This description is given to confirm that embodiments that support the invention described in the present specification are written in the present specification. Therefore, even if there is an embodiment included in the embodiments of the invention but not written as one that corresponds to an aspect of the invention, it does not mean that the embodiment does not correspond to the aspect of the invention. Conversely, even if an embodiment is written here as one that corresponds to an aspect of the invention, it does not mean that the embodiment does not correspond any other aspect of the invention.

Further, this description does not cover all of the aspects of the invention written in the present specification. In other words, this description does not deny the existence of an aspect of the invention that is described in the present invention but not claimed in the present application, that is, an aspect of the invention that may be filed in a division application or may appear or be added through an amendment.

That is, a sensing apparatus according to one aspect of the present invention includes a measurement section (for example, a measurement section 113 in FIG. 27) that measures capacitance of each of a plurality of first electric capacitors having unknown capacitance (for example, capacitors Cx1 through Cx4 in FIG. 26), a plurality of contact sections (for example, electrodes E1 through E4 in FIG. 26) that are electrically connected to the plurality of first electric capacitors and that a human body disposed proximally touches directly or indirectly through an insulator, a determination section (for example, a control section 112 in FIG. 27) that determines whether a human body has touched the contact section either directly or indirectly based on a result of comparison between the capacitance of the plurality of first electric capacitors measured by the measurement section and a threshold value for each of the plurality of first electric capacitors, a storage section (for example, a storage section 112a in FIG. 27) that cumulatively stores a result of measurement for each of the plurality of first electric capacitors, which is a result of measurement by the measurement section, a reference capacitance calculation section (for example, a reference value calculation section 112b in FIG. 27) that calculates reference capacitance for each of the plurality of first electric capacitors based on the result of measurement stored in the storage section, a difference calculation section (for example, a difference calculation section 112c in FIG. 27) that calculates an absolute difference value between the reference capacitance for each of the plurality of first electric capacitors and the result of measurement for each of the plurality of first electric capacitors performed by the measurement section, and an adjustment section (for example, a threshold value adjustment section 112d) that adjusts the threshold value for each of the plurality of first electric capacitors based on a sum of the absolute difference value for each of the first electric capacitors calculated by the difference calculation section other than the absolute difference value of each of the first electric capacitors.

The sensing apparatus can further include a third electric capacitor (for example, a capacitor Ca in FIG. 26) whose first end is connected to a second end of a circuit whose first end is grounded and which connects in series a second electric capacitor (for example, a capacitor Cs11 in FIG. 26) having known capacitance and the first electric capacitors (for example, capacitors Cx1 through Cx4 in FIG. 26) and whose second end is grounded, to apply its own charging voltage to the second end of the circuit, thereby charging the first electric capacitors and the plurality of second electric capacitors having the known capacitance and respectively corresponding to the first electric capacitors, a first discharge section (for example, a switch SW2 in FIG. 2) that discharges the third electric capacitor partly and the second electric capacitors totally, a second discharge section (for example, a switch SW3 in FIG. 2) that discharges the first electric capacitors totally at substantially the same timing as the first discharge section, a counter section (for example, a counter 112a in FIG. 27) that measures the number of times of discharge by the first discharge section and the second discharge section, and a comparison section (for example, a comparison section 113b in FIG. 27) that compares a charging voltage for the first electric capacitors and a reference voltage, wherein when discharge is repeated by the first and second discharge sections and when a result of comparison by the comparison section indicates that the charging voltage for the first electric capacitors agrees with the reference voltage or smaller than the reference voltage, the measurement section (for example, a measurement section 113 in FIG. 27) can calculate the capacitance of the first electric capacitors based on the current number of times of discharge measured by the counter section, thereby measuring the capacitance of the first electric capacitors.

Figure 7:
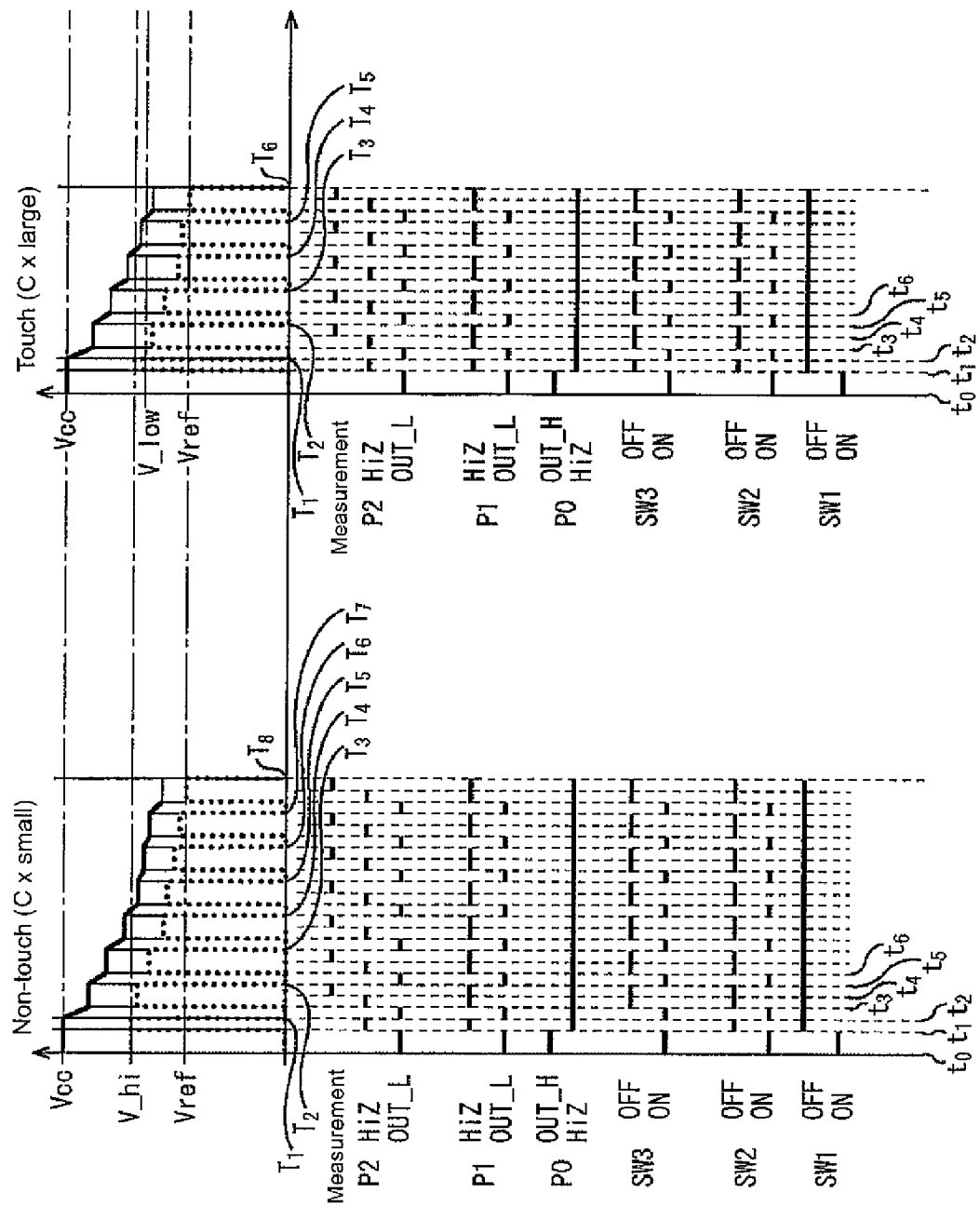
FIG. 7 shows an explanatory timing chart of the measurement processing by the touch sensor of FIG. 1.

The first discharge section can discharge the third electric capacitor (for example, the capacitor Ca in FIG. 26) which has been charged for a predetermined period of time (for example, from (time t(i+1) to time ti) after time t1 in FIG. 7) through a resistor connected in series to the third electric capacitor, thereby discharging the third electric capacitor partly.

A charge section that charges the third electric capacitor (for example, the capacitor Ca in FIG. 26) at a predetermined charging voltage can be further provided, wherein the charge section (for example, a power supply Vcc in FIG. 2) can charge the third electric capacitor directly.

A charge section (for example, a power supply Vcc in FIG. 13) that charges the third electric capacitor at a predetermined charging voltage can be further provided, wherein the first discharge section has its first end grounded and its second end connected between the circuit and the resistor, and the charge section can charge the third electric capacitor from the same position as the second end of the first discharge section.

A diode (for example, a diode D21 in FIG. 26) can be provided in parallel with the resistor and in a forward direction toward the third electric capacitor.

A switch section (for example, a switch section 101 in FIG. 27) can be further provided which switches one of the second electric capacitors having the known capacitance and the plurality of first electric capacitors in order to connect them in series.

The adjustment section (the threshold value adjustment section 112d in FIG. 27) can adjust the threshold value by subtracting from the threshold value for each of the first electric capacitors a value of the sum of the absolute difference value for each of the plurality of first electric capacitors calculated by the difference calculation section other than the absolute difference value of each of the first electric capacitors.

A sensing method according to one aspect of the present invention includes a measurement step (for example, step S34 in FIG. 5) of measuring capacitance of each of a plurality of first electric capacitors having unknown capacitance, a determination step (for example, step S75 and S76 in FIG. 28) of determining whether a human body has touched the contact section either directly or indirectly based on a result of comparison between the capacitance of the plurality of first electric capacitors measured by the measurement section and a threshold value for each of the plurality of first electric capacitors, a storage step (for example, step S91 in FIG. 29) of cumulatively storing a result of measurement for each of the plurality of first electric capacitors, which is a result of measurement through processing of the measurement step, a reference capacitance calculation step (for example, step S92 in FIG. 29) of calculating reference capacitance for each of the plurality of first electric capacitors based on the result of measurement stored through processing of the storage section, a difference calculation step (for example, step S93 in FIG. 29) of calculating an absolute difference value between the reference capacitance for each of the plurality of first electric capacitors and the result of measurement for each of the plurality of first electric capacitors performed through processing of the measurement step, and an adjustment step (for example, step S94 in FIG. 29) of adjusting the threshold value for each of the plurality of first electric capacitors based on a sum of the absolute difference value for each of the first electric capacitors calculated through processing of the difference calculation step other than the absolute difference value of each of the first electric capacitors.

It is to be noted that a sensing program is similar to the sensing method and so its description is not given.

FIG. 1 shows an embodiment of a touch sensor to which the present invention is applied.

A microcomputer 1 includes a central processing unit (CPU), a random access memory (RAM), a read only memory (ROM), and the like in such a configuration that the CPU may expand a predetermined program stored in the ROM in the RAM and executes it as required, thereby performing various kinds of processing. More specifically, by executing the program, the microcomputer 1 provides terminals P0 to P2 with a Hi signal or a Low signal as an output signal, to establish HiZ (high-impedance state, in which no input signal is received, thus resulting in the output signal being in neither the Hi state nor the Low state) and, as required, measures the input signal (a voltage at the terminal) and perform processing in accordance with a result of the measurement.

The terminal P0 is used to supply power with which a capacitor Ca is charged and, if regulated to the Hi state, applies a charging voltage to the capacitor Ca. It is to be noted that if regulated to the HiZ (high-impedance state), the terminal P0 stops charging.

The terminal P1 is used to discharge the capacitor Ca through a resistor R and also discharges a capacitor Cs, and if regulated to the Low state, discharges the capacitors Ca and Cs, and if regulated to the HiZ state, stops discharging.

The terminal P2 is used to discharge a capacitor Cx and measures a charging voltage for the capacitor Cx, and if regulated to the Low state, discharges the capacitor Cx, and if regulated to the HiZ state, stops discharging the capacitor Cx, and if regulated to the Hi state, measures a charging voltage Vx for the capacitor Cx.

The capacitor Ca is charged at a voltage applied from the terminal P0 and discharged through the resistor R by the terminal P1. The capacitors Cs and Cx are connected in series and charged by the capacitor Ca.

The capacitor Cx is an indication in a circuit configuration and indicates as an electric capacitor a target of measuring electrostatic capacitance such as a human body that touches an electrode E. Therefore, the capacitance of the capacitor Cx indicates electrostatic capacitance of a human body in a case where the human body has touched the electrode E and electrostatic capacitance in a non-contact condition in a case where a human body has not touched the electrode E.

It is to be noted that the electrode E may have such a constitution that a human body can touch it directly or touch it indirectly through an insulator. In the following description, it is assumed that the electrode E used here is such a type that a human body can touch it indirectly through an insulator; however, of course, it is needless to say that the electrode may be such a type that a human body can touch it directly. However, in a case where the electrode is such a type as to be touched by a human body through an insulator, a change in electrostatic capacitance (difference in electrostatic capacitance of the capacitor Cx between the case of contact and the case of non-contact) will be smaller than a case where the electrode is such a type as to be touched by a human body directly.

Figure 2:
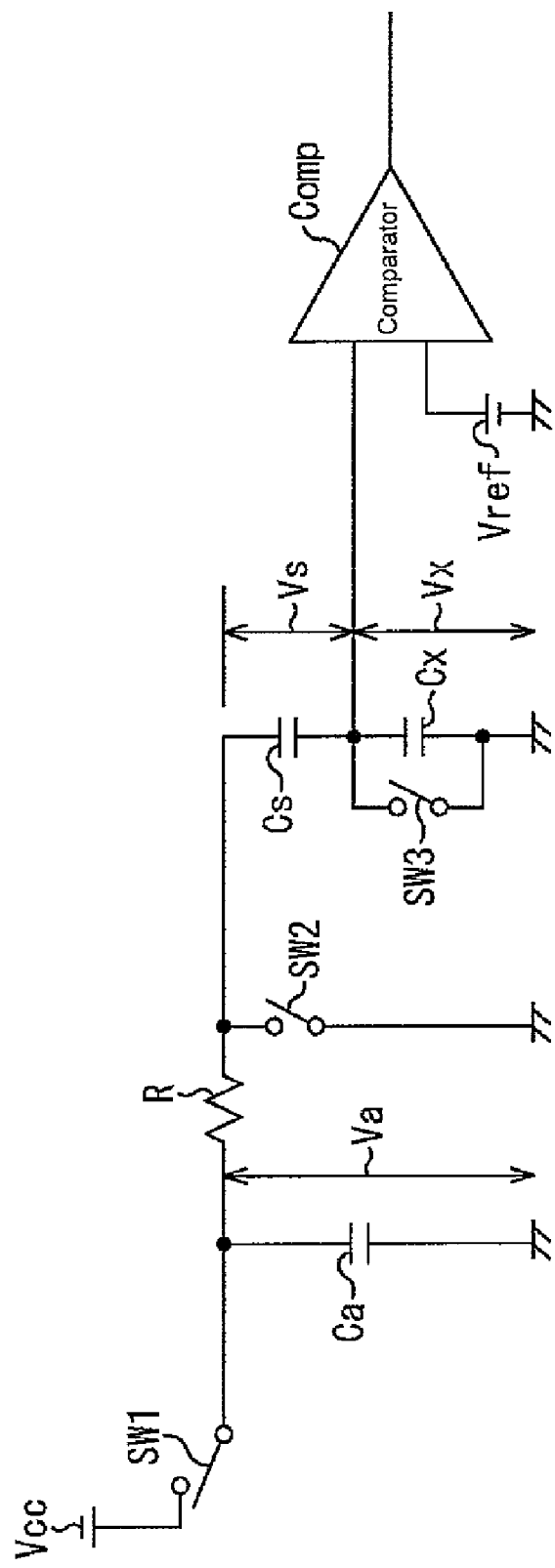
FIG. 2 shows an explanatory circuit diagram of a concept of the touch sensor of FIG. 1.

FIG. 2 is an explanatory circuit diagram of the concept of the touch sensor of FIG. 1.

Switches SW1 through SW3 straightforwardly indicate the operating states of the terminals P0 through P2 respectively. That is, if the terminal P0 is regulated to the Hi state, the switch SW1 in the circuit of FIG. 2 turns ON, resulting in a power supply Vcc charging the capacitor Ca at a charging voltage Vcc. On the other hand, if the terminal P0 is regulated to the HiZ state, the switch SW0 turns OFF. Further, if the terminal P1 is regulated to the Low state, the switch SW2 in the circuit of the figure turns ON, and if regulated to the HiZ state, the switch SW2 turns OFF.

Further, if the terminal P2 is regulated to the Low state, the switch SW3 turns ON and, if regulated to the HiZ state, the switch SW3 turns OFF. Also, if the terminal P2 is regulated to the Hi state, a comparator Comp compares a charging voltage Vx for the capacitor Cx to a reference voltage Vref and outputs a result of the comparison. It is to be noted that the comparator Comp is not an actual comparator circuit but is a function which is realized by the later-described microcomputer 1.

It is to be noted that charging voltages for the capacitors Ca, Cs, and Cx will be indicated by Va, Vs, and Vx respectively.

Next, functions which are realized by the microcomputer 1 will be described below with reference to FIG. 3.

A control section 11 controls the entire operation of the microcomputer 1, and when instructed by an operation section (not shown), causes a switching section 12 to control the operations of the terminals P0 through P2. Further, the control section 11 determines whether a human body came in contact based on a result of measurement of the electrostatic capacitance of the capacitor Cx by a measurement section 13 and controls an output section 14 including a cathode ray tube (CRT), a liquid crystal display (LCD), or a speaker so that the output section 13 presents a result of determination on whether the human body has come in contact or not.

Figure 3:
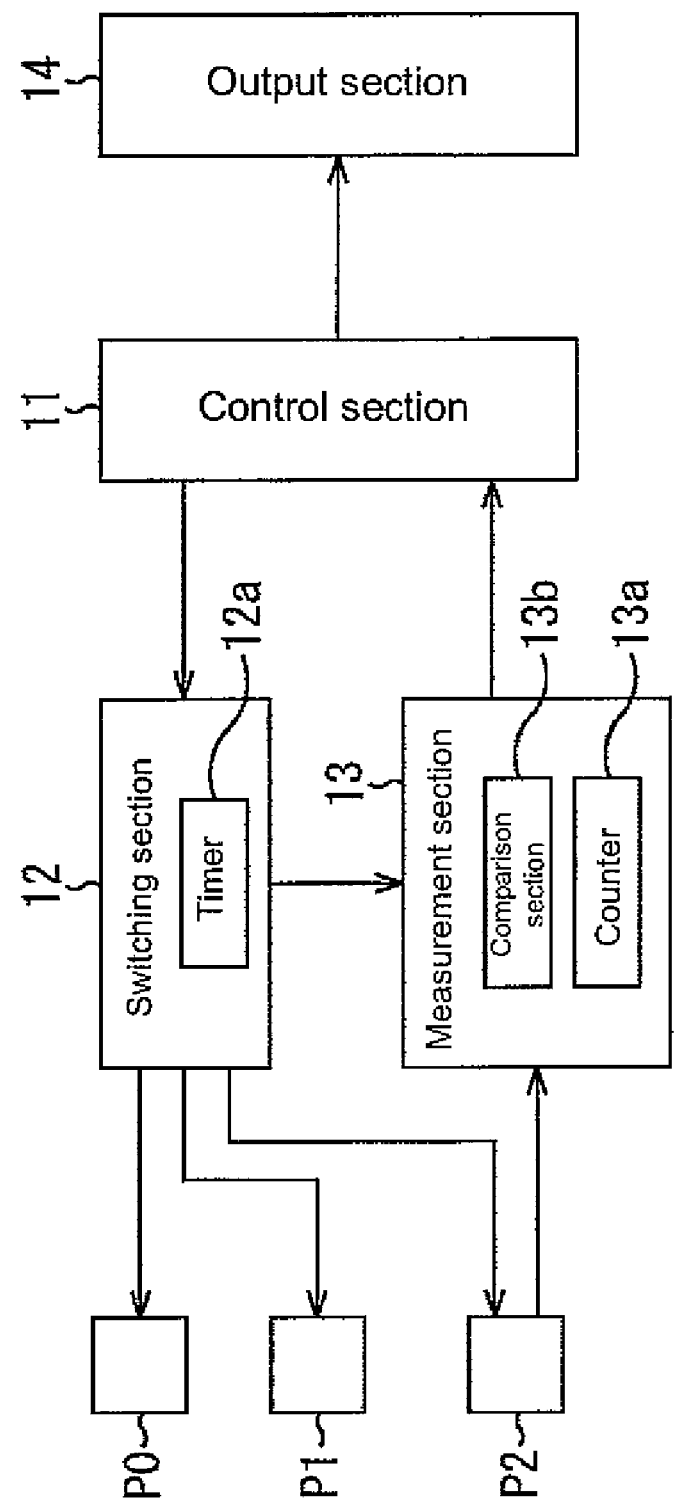
FIG. 3 shows an explanatory diagram of functions which are realized by a microcomputer of FIG. 1.

When supplied with a Hi-state signal from the switching section 12, the terminal P0 causes the power supply Vcc to charge the capacitor Ca at the charging voltage Vcc as in a case where the switch SW1 of FIG. 2 is turned ON, which is not shown in FIG. 3. Also, if regulated to the HiZ state by the switching section 12, the terminal P0 causes the power supply Vcc to stop supplying power to the capacitor Ca as in a case where the switch SW1 in FIG. 2 is turned OFF.

If regulated to the Low state by the switching section 12, the terminal P1 turns ON the switch SW2 in FIG. 2 to gradually discharge the capacitor Ca through the resistor R from the grounding point and instantaneously discharges the capacitor Cs totally from the grounding point. Further, if regulated to the HiZ state by the switching section 12, the terminal P1 turns OFF the switch SW2 in FIG. 2 to connect the capacitor Ca and a combined capacitor of the capacitors Cs and Cx in parallel.

If regulated to the Low state by the switching section 12, the terminal P2 turns ON the switch SW3 in FIG. 2 to discharge the capacitor Cx. Also, if regulated to the HiZ state by the switching section 12, the terminal P2 turns OFF the switch SW3 to hold the capacitor Cx in a charged condition. Further, if regulated to the Hi state by the switching section 12, the terminal P2 measures a charging voltage of the capacitor Cx.

The switching section 12 controls the operations of the terminals P0 through P2 at predetermined intervals by referencing a built-in timer 12a. More specifically, at predetermined intervals, the switching section 12 periodically switches the terminals P0 through P2 to the Hi, HiZ, or Low state in a predetermined pattern. Further, each time one cycle of the operations repeated in the predetermined pattern ends, the switching section 12 supplies the measurement section 13 with a signal to that effect.

The measurement section 13 measures the charging voltage Vx for the capacitor Cx supplied from the terminal P2 and compares it to the reference voltage Vref, and if it agrees with the reference voltage Vref or smaller than it, measures electrostatic capacitance based on the current processing count n stored in a counter 13a, electrostatic capacitance of the capacitors Ca and Cs, resistance of the resistor R, and the charging voltage Vcc of the power supply Vcc.

The counter 13a of the measurement section 13 counts cycle count (number of times of repetitive processing) n based on a signal supplied from the switching section 12 each time the operations are repeated in the predetermined pattern, and to average the processing counts n, counts calculated count m of the processing count n and a total sum N of m number of times of processing count n.

A comparison section 13b, which corresponds in constitution to the comparator Comp in FIG. 2, compares the charging voltage Vx supplied from the terminal P2 to the reference voltage Vref, and if the charging voltage Vx agrees with the reference voltage Vref or smaller than it, calculates electrostatic capacitance of the capacitor Cx based on the current processing count n stored in the counter 13a, electrostatic capacitance of the capacitors Ca and Cs, resistance of the resistor R, and the charging voltage Vcc of the power supply Vcc and outputs it to the control section 11 as a measurement result for the capacitor Cx.

Next, touch switching processing by the touch sensor of FIG. 1 will be described below with reference to the flowchart of FIG. 4.

In step S1, the control section 11 initializes the operation states of the switching section 12 and the measurement section 13.

In step S2, the control section 11 causes the switching section 12 to perform switching so that the measurement section 13 measures electrostatic capacitance of the capacitor Cx.

Now, processing to measure the electrostatic capacitance of the capacitor Cx will be described below with reference to the flowchart of FIG. 5.

In step S21, the measurement section 13 initializes the counters m and N of the counter 13a to 0.

In step S22, the measurement section 13 initializes the counter n of the counter 13a to 0.

In step S23, the counter 13a of the measurement section 13 increments the counter m by 1.

In step S24, the switching section 12 regulates the output of the terminal P0 to Hi, to charge the capacitor Ca by using the power supply Vcc. That is, by regulating the output of the terminal P0 to Hi, the switch SW1 shown in FIG. 2 turns ON so that the capacitor Ca is supplied with power from the power supply Vcc to be charged at a charging voltage Va=Vcc.

In step S25, the switching section 12 holds the capacitor Ca in a charged state by regulating all of terminals P0 through P2 to HiZ (high-impedance state) for a predetermined time t based on the timer 12a. That is, by regulating the terminals P0 through P2 to the HiZ state, the switches SW1 and Sw2 shown in FIG. 2 are turned OFF to hold the capacitor Ca in a condition where it is charged at the charging voltage Va=Vcc.

In step S26, the counter 13a of the measurement section 13 increments the counter n by 1.

In step S27, the switching section 12 regulates the terminal P0 to HiZ and the terminals P1 and P2 to Low for a predetermined period of time based on the timer 12a, thereby discharging the capacitors Ca, Cs, and Cx. In this case, the capacitors Cs and Cx are discharged through the ground instantaneously, whereas the capacitor Ca is discharged by the SW2 through the resistor R to the ground gradually and therefore, will be discharged only partly within a predetermined time t.

In step S28, the switching section 12 regulates the terminals P0 through P2 to the HiZ state for a predetermined time t based on the timer 12a to transfer charge in the capacitor Ca (charge left in a condition where it is partly discharged by the processing in step S27) to the capacitors Cs and Cx, thereby holding the capacitors Ca, Cs, and Cx in a charged state. In this case, since the capacitor Ca and the combined capacitor of the capacitors Cs and Cx are formed into a parallel circuit, the charging voltage Va for the capacitor Ca will be equal to a sum of the charging voltages Vs and Vx for the capacitors Cs and Cx respectively. Further, the ratio between the charging voltages Vs and Vx for the capacitors Cs and Cx will be a ratio between reciprocals of capacitance values of the capacitors Cs and Cx.

In step S29, the switching section 12 regulates the terminal P2 to the Hi state for the predetermined time t based on the timer 12a so that the measurement section 13 measures a charging voltage Vx for the capacitor Cx through the terminal P2 for the predetermined time t, thereby acquiring the charging voltage for the capacitor Cx.

In step S30, the comparison section 13b of the measurement section 13 determines whether a measured value of the charging voltage Vx for the capacitor Cx is smaller than the reference voltage Vref. For example, if it is determined that the charging voltage Vx is not smaller than the reference voltage Vref, the process returns to step S26. That is, until it is determined in step S30 that the charging voltage Vx is smaller than the reference voltage Vref, processing of steps 26 to 30 will be repeated, and the value of the counter n is incremented each time the processing is repeated.

If it is determined in step S30 that the charging voltage Vx is smaller than the reference voltage Vref, in step S31, the measurement section 13 adds a freshly obtained processing count n to the total sum N of the number of times the processing of steps S26 to S30 is repeated.

In step S32, the measurement section 13 determines whether a value of repetitive processing count n obtained by the counter m is at least a predetermined upper limit value M of the counter m, and if it is determined that the counter m is less than the upper limit value M, the process returns to step S22. That is, until the value of the counter m is at least the upper limit value M, the processing of steps S22 to S32 will be repeated.

If it is determined in step S32 that the value of the counter m is at least the upper limit value M, in step S33, the measurement section 13 obtains as count an average value of M number of times of the processing counts n through the processing of steps S26 to S30 repeated until the charging voltage Vx for the capacitor Cx falls to the reference voltage Vref.

In step S33, the measurement section 13 calculates an electrostatic capacitance value of the capacitor Cx based on an average value count of the processing counts n, capacitance values of the capacitors Ca and Cs, predetermined times t for which the processing of steps S25, S27, and S28 are performed, the charging voltage Vcc of the power supply Vcc, and the reference voltage Vref and outputs the electrostatic capacitance value of the capacitor Cx to the control section 11, thus ending the measurement processing.

That is, the above processing may be summarized as follows: in step S24, the processing of the first step of FIG. 6 is performed, that is, the switch SW1 of FIG. 2 is turned ON. This processing merely charges the capacitor Ca, and therefore the switches SW2 and SW3 may be in the ON state or the OFF state.

As a result, as shown in the left half of FIG. 7, through the processing of the first step of FIG. 6, the terminal P0 is regulated to Hi at time t0 to turn ON the switch SW1 of FIG. 2, thereby charging the capacitor Ca at the charging voltage Va=Vcc. It is to be noted that although, in FIG. 7, the switches SW2 and SW3 are in the ON state (with the terminals P1 and P2 at Low), the upper-part capacitor Cx charging voltage indicates Vx=V_hi in a case where the capacitor Cx is charged through the resistor R in a condition where the switches SW2 and SW3 are in the OFF state. In this case, the capacitors Cs and Cx are connected in series, so that a relationship of Va=Vx+Vc is established. Further, the capacitors Cs and Cx are connected in series, so that a ratio between the charging voltages Vx and Vs is Vx:Vs=1/Cs:1/Cx.

It is to be noted that in FIG. 7, in an upper-part graph, a bold solid line indicates the charging voltage Va for the capacitor Ca and a dotted line indicates the charging voltage Vx for the capacitor Cx. Further, below it, the operation state of the terminal P2 is shown for measuring (the charging voltage Vx) for the capacitor Cx by the measurement section 13 through the terminal P2, in which HiZ indicates a high-impedance state, that is, a state where the terminal P2 is providing no output, and OUT_L indicates a state where it is set to Low.

Below the terminal P2, the operation state of the terminal P1 is shown, in which HiZ indicates a high-impedance state, that is, a state where the terminal P1 is providing no output and OUT_L indicates a state where it is set to Low. Below the terminal P1, the operation state of the terminal P0 is shown, in which HiZ indicates a high-impedance state, that is, a state where the terminal P0 is providing no output, and OUT_L indicates a state where it is set to Low.

Further therebelow, the operation states of the switches SW3 to SW1 are shown respectively. It is to be noted that the switch SW1 operates in conjunction with the terminal P0 such that the switch SW1 is turned ON only when the terminal P0 is set to Hi and, otherwise, in the OFF state. Also, the switches SW2 and SW3 operate in conjunction with the terminals P1 and P2 such that the switches SW2 and SW3 are turned ON only when the terminals P1 and P2 are set to Low and, otherwise, in the OFF state respectively Further, various processing timings shown in FIG. 7, for example, even the same timing in FIG. 7 may fluctuate temporally through a processing procedure depending on a program installed in the microcomputer 1; however, the fluctuation can be ignored sufficiently in terms of the whole operations.

Further, in the processing of step S25, the processing of the second step of FIG. 6 is performed, that is, the switches SW1 to SW3 of FIG. 2 are turned OFF. As a result, through the processing of the second step of FIG. 6, as shown by the left half of FIG. 7, at time t1, the terminals P0 through P2 are regulated to HiZ to turn OFF the switches SW1 to SW3 of FIG. 2, thereby holding the capacitor Ca in a condition where it is charged at the charging voltage Va=Vcc.

In the processing of step S27, the processing of the third step of FIG. 6 is performed, that is, the switch SW1 of FIG. 2 is turned OFF and the switches SW2 and SW3 are turned ON. As a result, through the processing of the third step of FIG. 6, as shown by the left half of FIG. 7, at time t2, the terminals P1 and P2 are regulated to Low to turn ON the switches SW2 and SW3 of FIG. 2, thereby discharging the capacitors Cx and Cs totally and gradually discharging the capacitor Ca through the resistor R only partly.

Further, in the processing of step S28, the processing of the fourth step of FIG. 6 is performed, that is, the switches SW1 to SW3 of FIG. 2 are turned OFF. As a result, at time t3, the capacitor Ca is partly discharged through the resistor R between time t2 and time t3 (for a time t), and then charges still left on the capacitor Ca causes the capacitors Ca, Cs, and Cx to be held in a charged state. That is, as the capacitor Ca is partly discharged between time t2 and time t3, the charging voltage Va for the capacitor Ca decreases as shown in FIG. 7. Therefore, as described above, if the switches SW1 and SW2 are turned OFF through the processing of the first step, the charging voltage Vx applied on the capacitor Cx is also reduced correspondingly below an initial value of the charging voltage V_hi. However, the ratio between the respective charging voltages Vs and Vx for the capacitors Cs and Cx is kept constant.

In the processing of step S29, the processing of the fifth step of FIG. 6 is performed, that is, unless a value of the charging voltage Vx for the capacitor Cx measured by the measurement section 13 through the terminal P2 at time t4 in a condition where the switches SW1 to SW3 of FIG. 2 remain in the OFF state is smaller than the reference voltage Vref, the processing of steps S26 to S30, that is, the processing of the third through fifth steps of FIG. 6 will be repeated.

That is, processing similar to the above processing to be performed between time T1 (=time t2) and time T2 (=time t5) in FIG. 7 will be repeated between time T2 and time T3, time T3 and time T4, time T4 and time T5, . . . as shown in FIG. 7 as the processing of the third through fifth steps shown in FIG. 6 is repeated.

As a result, each time the processing of the third through fifth steps is performed, the charging voltage for the capacitor Ca decreases along with that for the capacitor Cx.

It is thus possible to obtain an electrostatic capacitance value of the capacitor Cx based on a repetitive processing time count of the processing of the third through fifth steps that has been performed until the charging voltage Vx for the capacitor Cx is reduced to the reference voltage Vref.

That is, as described above, since the sum of the charging voltage Vx for the capacitor Cx and the charging voltage Vs for the capacitor Cs is equal to the charging voltage Va for the capacitor Ca, when the charging voltage Va for the capacitor Ca is decreased as the processing of the third through fifth steps is repeated, the charging voltage Vx for the capacitor Cx will also continue to decrease in a condition where its ratio with respect to the charging voltage Va for the capacitor Ca is kept constant.

Therefore, as shown in FIG. 7, for example, the larger a difference between the charging voltage Vx for the capacitor Cx and the reference voltage Vref is, the more the processing of the third through fifth steps in FIG. 6 must be performed to permit the charging voltage Vx for the capacitor Cx to reach the reference voltage Vref; conversely, the smaller the difference between the charging voltage Vx for the capacitor Cx and the reference voltage Vref is, the less the processing of the third through fifth steps in FIG. 6 must be performed to permit the charging voltage Vx for the capacitor Cx to reach the reference voltage Vref.

That is, in the left half of FIG. 7, the initial charging voltage Vx for the capacitor Cx is Vx=V_hi, whose difference with respect to the reference voltage Vref is larger than that of the initial charging voltage Vx for the capacitor Cx in the right half of FIG. 7, which is Vx=V_low. Therefore, in the left half of FIG. 7, the processing of the third through fifth steps of FIG. 6 is performed seven times (between times T1 and T8) until the charging voltage Vx for the capacitor Cx is reduced to the reference voltage Vref, whereas in the right half of FIG. 7, the processing of the third through fifth steps of FIG. 6 is performed five times (between times T1 and T6) until the charging voltage Vx for the capacitor Cx is reduced to the reference voltage Vref.

Figure 8:
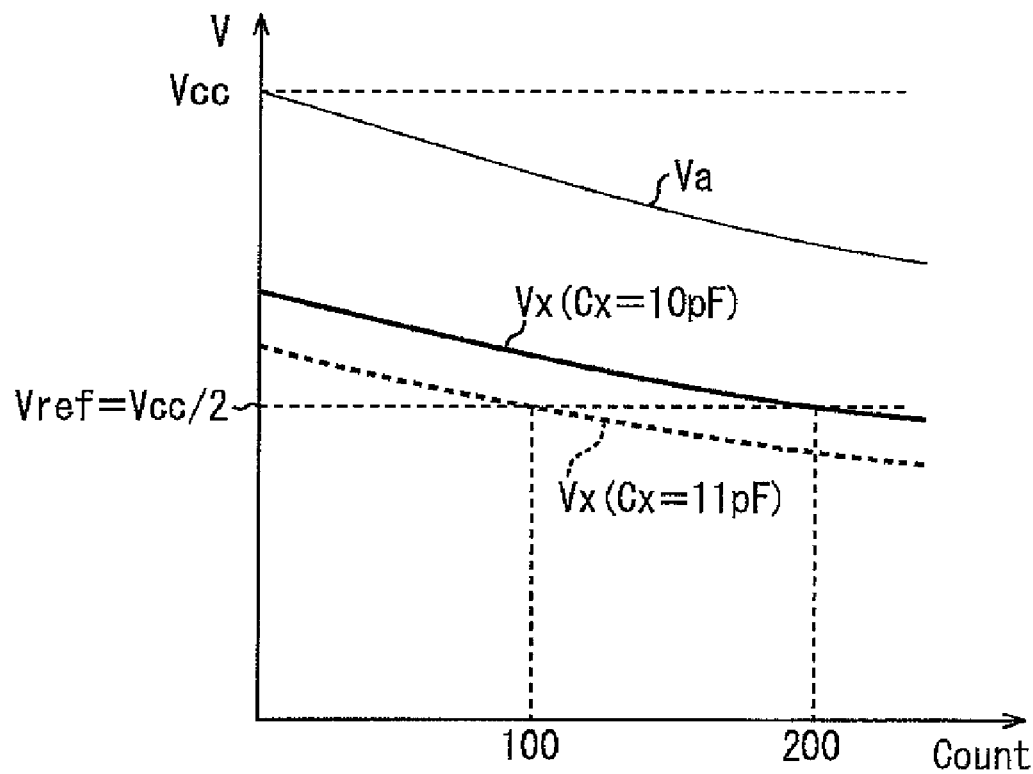
FIG. 8 shows an explanatory graph of a method for calculating unknown capacitance of a capacitor.

As a result, as shown in FIG. 8, as the electrostatic capacitance of the capacitor Cx increases (as the initial charging voltage Vx for the capacitor Cx decreases), the processing needs to be performed a smaller number of times in order to reduce the charging voltage Vx to the reference voltage Vref. In FIG. 8, its horizontal axis represents the number of times of processing count and its vertical axis represents the voltage. Further, in FIG. 8, a thin line indicates the charging voltage Va for the capacitor Ca, a bold line indicates a change in the charging voltage Vx in a case where the electrostatic capacitance of the capacitor Cx is 10 pF, and a dotted line indicates a change in the charging voltage Vx in a case where the electrostatic capacitance of the capacitor Cx is 11 pF. In FIG. 8, in the case where the electrostatic capacitance of the capacitor Cx is 10 pF, when the number of times of processing count is 100, the voltage decreases to the reference voltage Vref (=Vcc/2), whereas in the case where the electrostatic capacitance of the capacitor Cx is 11 pF, when the number of times of processing count is 200, the voltage decreases to the reference voltage Vref (=Vcc/2), thus indicating that the larger the electrostatic capacitance of the capacitor Cx is, the smaller will be the number (count) of times of processing needed to be performed until the voltage decreases to the reference voltage Vref. It is to be noted that in FIG. 8, the capacitor Cs has electrostatic capacitance of 12 pF, the resistor R has resistance of 10 kΩ), the capacitor Ca has electrostatic capacitance of 0.1 μF, and a period of time (=between time t(i+1) and time ti) after time t1 in FIG. 7 is 2 μs.

Figure 5:
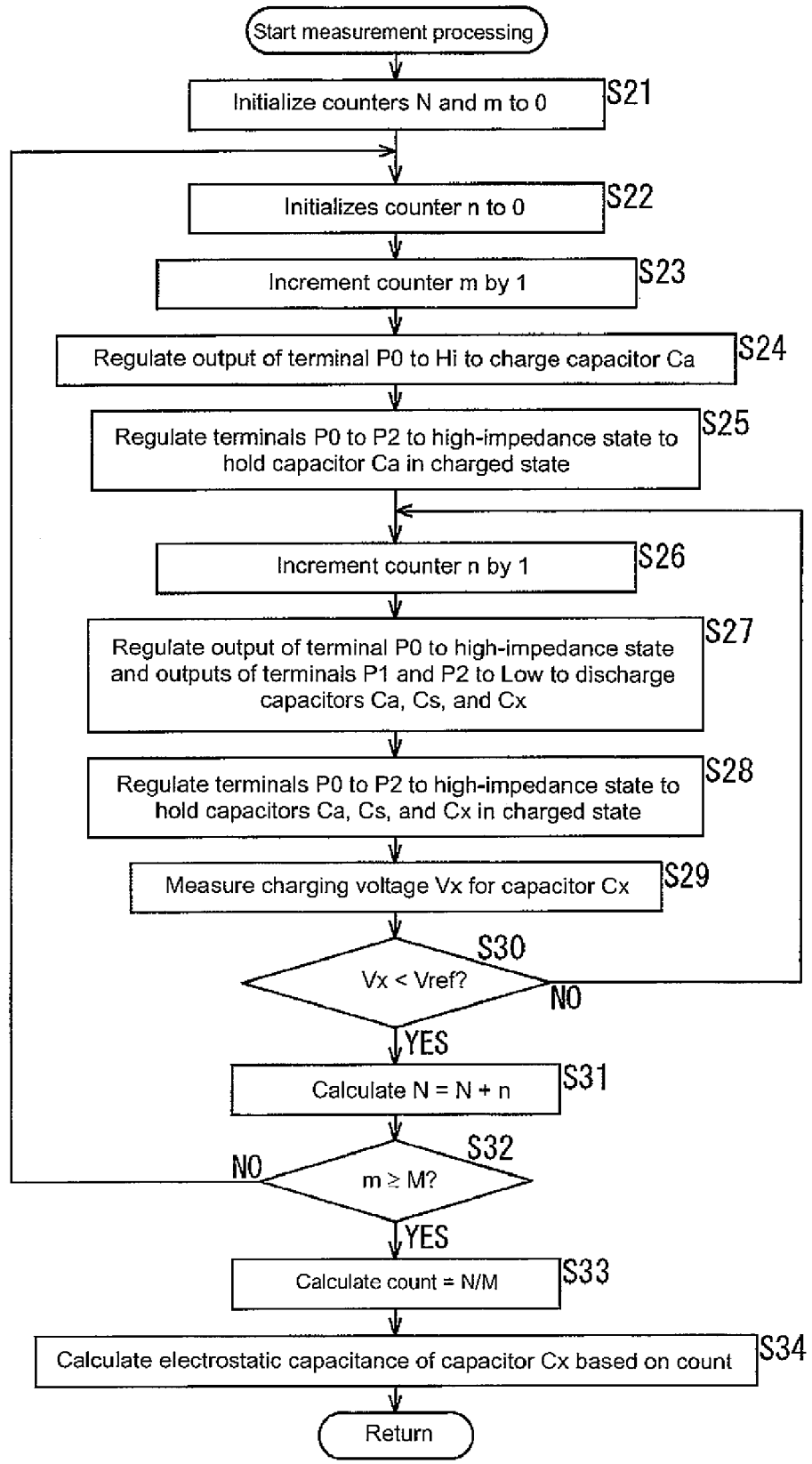
FIG. 5 shows an explanatory flowchart of measurement processing by the touch sensor of FIG. 1.

That is, in the processing of step S34 in the flowchart of FIG. 5, based on such properties, the electrostatic capacitance of the capacitor Cx is obtained from the number of times of repetitive processing count of the processing of the third through fifth steps of the above-described FIG. 6.

Figure 9:
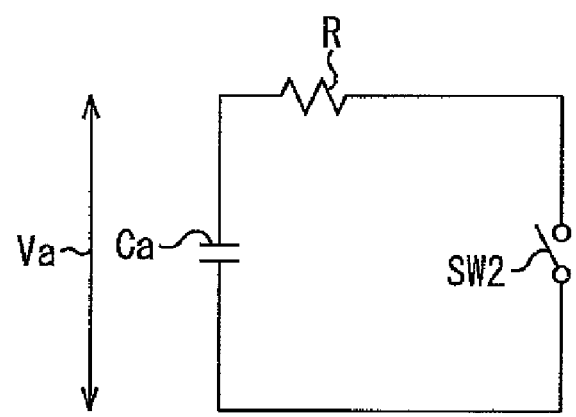
FIG. 9 shows an explanatory diagram of the method for calculating unknown capacitance of the capacitor.

That is, a relationship among the capacitor Ca, the resistor R, and the switch SW2 in FIG. 2 can be expressed as a closed circuit shown in FIG. 9. It is assumed that the capacitor Ca is already charged at the charging voltage Va=Vcc.

Figure 10:
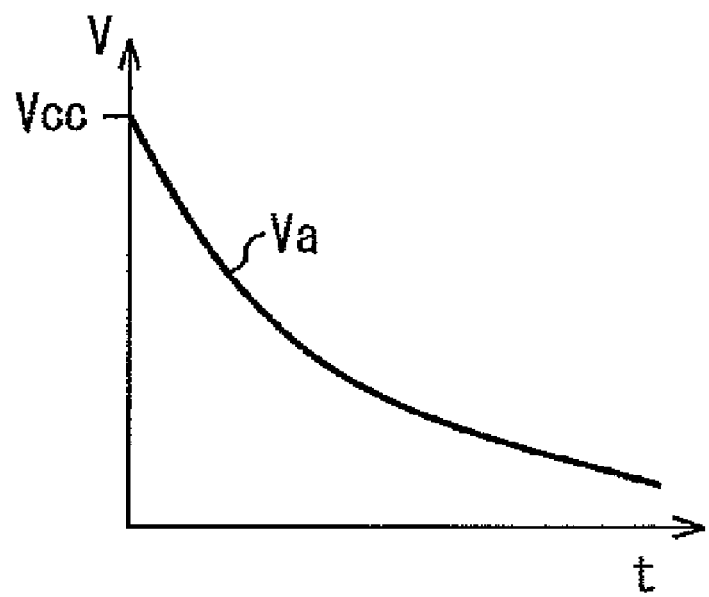
FIG. 10 shows an explanatory graph of the method for calculating unknown capacitance of the capacitor.

If the switch SW2 is turned ON, the charging voltage Va for the capacitor Ca attenuates with the elapse of a time t during which the switch is held in the ON state as shown in FIG. 10. This relationship can be expressed as the following equation (1):

$$Va = Vcc \times e^{\wedge}(-(\text{ON-state time of the switch } SW2)/(Ca \times R)) \quad (1)$$

In this equation, "^" indicates the exponential. The time during which the switch SW2 is held in the ON-state can be considered to be the number of times of repetitive processing count×time T if each processing time of the processing of the third through fifth steps of the above-described FIG. 6 is a constant value of time T. Therefore, this equation (1) can be expressed as the following equation (2). That is, in FIG. 7, from time t1 onwards, (time t(i+1) to time ti) is equal to a time t, so that each processing time (a time required to perform the processing of the third through fifth steps of FIG. 6 once) is 3t.

$$Va = Vcc \times e^{\wedge}(-(\text{count} \times 3t)/(Ca \times R)) \quad (2)$$

Figure 11:
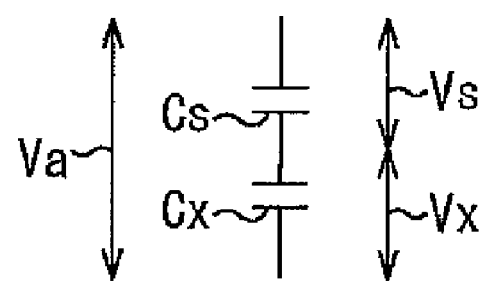
FIG. 11 shows an explanatory diagram of the method for calculating unknown capacitance of the capacitor.

On the other hand, as shown in FIG. 11, in the processing of the fifth step of FIG. 6, the switches SW1 to SW3 are held in the OFF state, so that the charging voltage Va for the capacitor Ca is a sum of the respective charging voltages Vs and Vx for the capacitors Cs and Cx, and the ratio between the charging voltages Vs and Vx is Vs:Vx=1/Cx:1/Cs, where Cs and Cx indicate the electrostatic capacitance of the capacitors Cs and Cx.

Therefore, the charging voltage Vx for the capacitor Cx is given by the following equation (3):

$$Vx = VCC((1/Cx)/((1/Cx)+(1/Cs)) \times e^{\wedge}(-(\text{count} \times 3t)/(Ca \times R)) \quad (3)$$

As a result, if the charging voltage Vx for the capacitor Cx agrees with the reference voltage Vref, the following equation (4) is established:

$$Vref = Vcc((1/Cx)/((1/Cx)+(1/Cs)) \times e^{\wedge}(-(\text{count} \times 3t)/(Ca \times R)) \quad (4)$$

From the above relationships, the electrostatic capacitance of the capacitor Cx is obtained from the following equation (5):

$$Cx = Cs(1-(Vcc/Vref) \times e^{\wedge}(-(\text{count} \times 3t)/(Ca \times R)) \quad (5)$$

Figure 12:
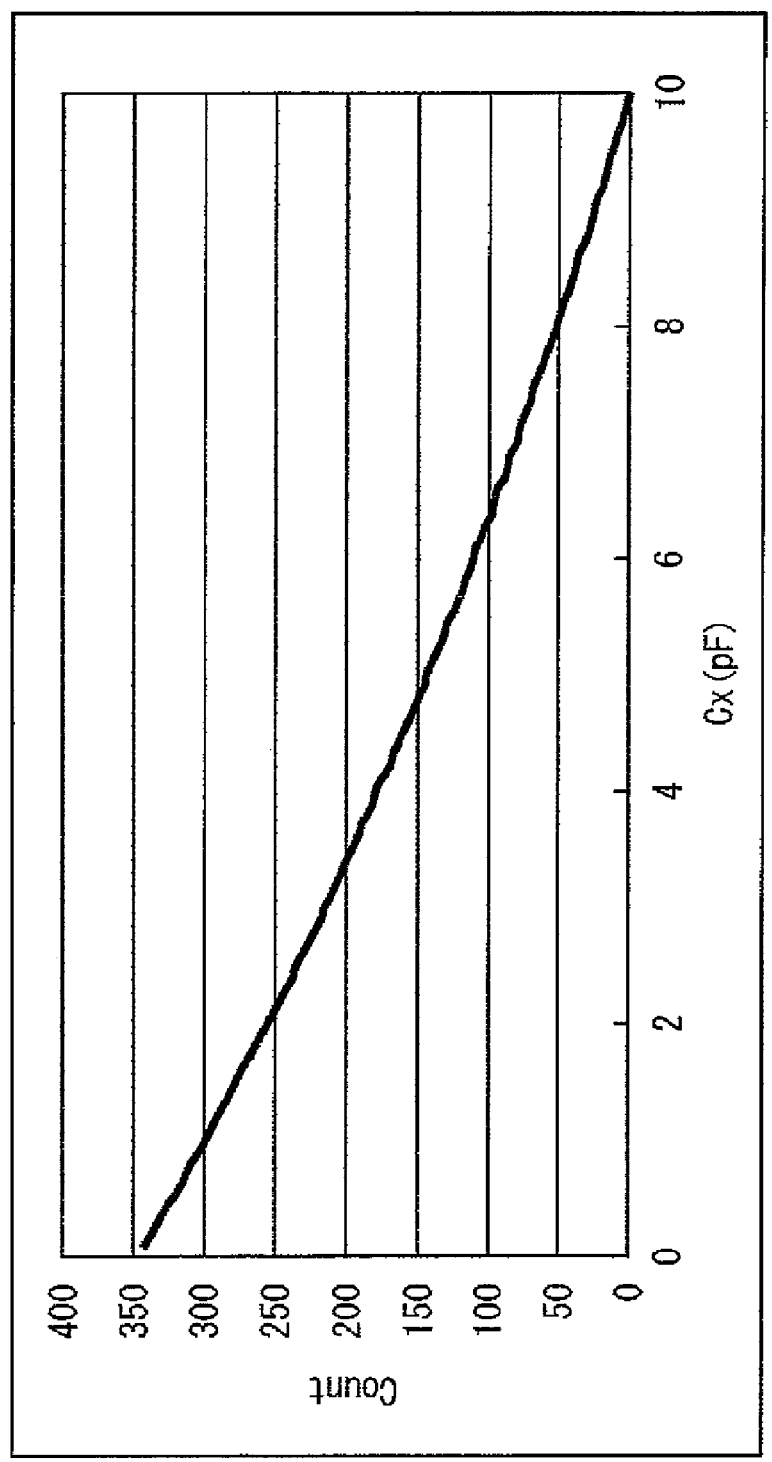
FIG. 12 shows an explanatory graph of the method for calculating unknown capacitance of the capacitor.

From Equation (5), a relationship between the capacitor Cx and the number of times of processing count will be such as shown in FIG. 12 when, for example, the capacitor Cs has electrostatic capacitance of 10 pF, the resistor R has resistance of 10 kΩ, the capacitor Ca has electrostatic capacitance of 0.1 μF, and the time t is 2 μs. In FIG. 12, when the electrostatic capacitance of the capacitor Cx is in the vicinity of 8 pF, electrostatic capacitance Cx is obtained at a resolution/pF of about 20 as referred to the number of times of processing count.

However, in the above processing, the electrostatic capacitance of the capacitor Cx is obtained from the above Equation (5) on a condition that the charging voltage Vx for the capacitor Cx is lowered through the repetitive processing so as to agree with the reference voltage Vref, so that it is assumed that the charging voltage Vx for the capacitor Cx at an initial charging should be larger than the reference voltage Vref. Therefore, the reference voltage Vref needs to satisfy the following Equation (6):

$$Vref/Vcc < (1/Cs)/((1/Cx)+(1/Cs)) \quad (6)$$

In the above processing, the smaller the time t after time t1 (=between time t(i+1) and time ti) is, the higher the resolution can be; however, conversely, if the time t is too small, the number of times of processing count will increase. In the case of a touch sensor (which has such a constitution that an electrode E indirectly contacts a human body through an insulator), since it is known that electrostatic capacitance in the case of contact of the human body is in the vicinity of 11 pF and that electrostatic capacitance in the case of non-contact is in the vicinity of 10 pF, the above Equation (6) is satisfied; and if the following Equation (7) is further satisfied, it is possible to enhance the resolution by reducing the time t and also to obtain the electrostatic capacitance of the capacitor Cx with a smaller number of times of processing.

$$Vref/Vcc \approx (1/Cs)/((1/Cx)+(1/Cs)) \quad (7)$$

That is, by setting the reference voltage Vref to a value close to a value of the charging voltage Vx for the capacitor Cx corresponding to the charging voltage Va for the capacitor Ca, the number of times of processing can be reduced and, by that much, the time t can be decreased to enhance the resolution.

As a result, it is possible to measure and obtain unknown electrostatic capacitance of a capacitor with higher accuracy and using a smaller number of times of processing than the conventional method of obtaining it after charging the capacitor by repeating the processing starting from a charging voltage of 0. Therefore, for example, even if the electrode E has a constitution that a human body indirectly contacts it through an insulator and the capacitor Cx has a small change in electrostatic capacitance (even if a change in electrostatic capacitance of the capacitor Cx is small between the case of human body contact and the case of human body non-contact), it is possible to detect the electrostatic capacitance with high accuracy and at a high speed by setting the reference voltage Vref and charging voltage Vcc so as to satisfy the above Equations (6) and (7) in accordance with a change in electrostatic capacitance.

Further, processing of steps S31 to S33 in the flowchart of FIG. 5 is used to obtain an average value of M number of times of processing count n as the number of processing count, so that even if, for example, ripple noise occurs in one measurement, the processing count can be obtained accurately. It is to be noted that if no ripple noise is found in ripple noise occurrence detection, the processing speed may be increased by decreasing the number of times of repeating the processing required to obtain an average value by setting M to 1.

Figure 4:
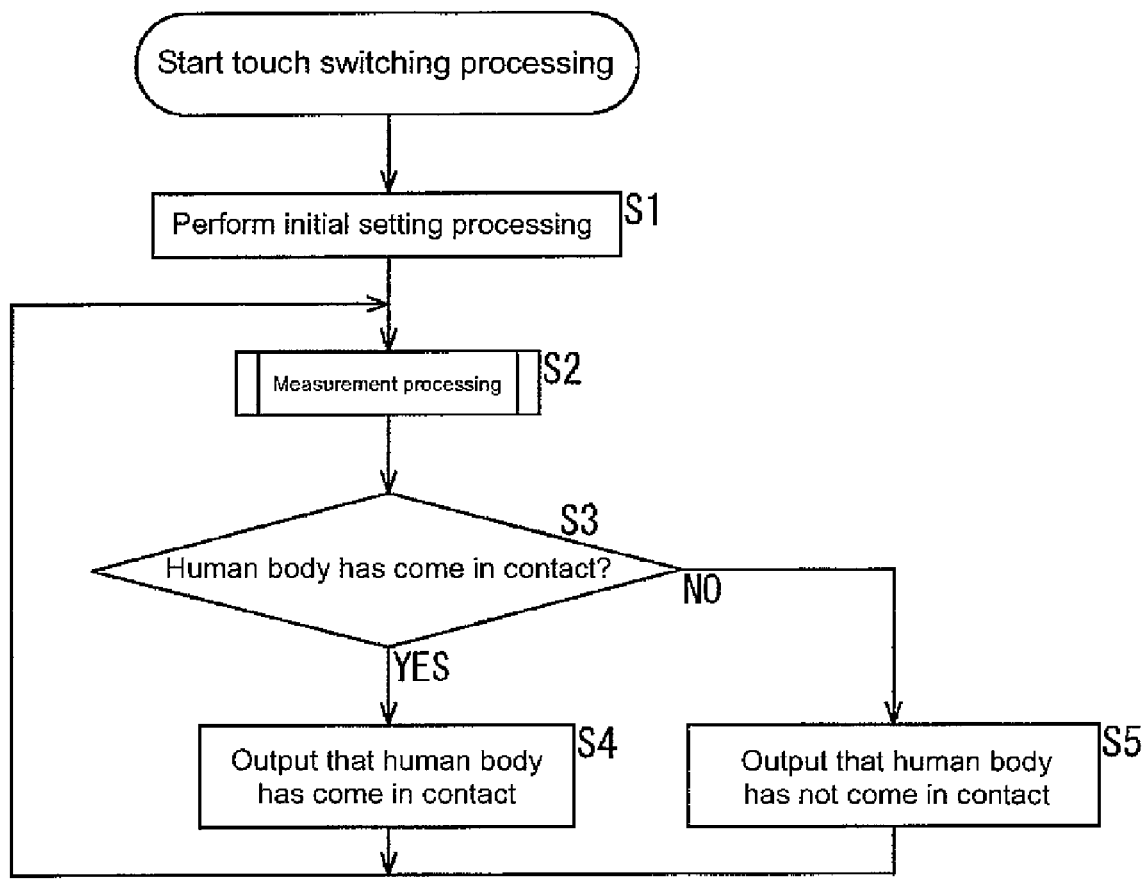
FIG. 4 shows an explanatory flowchart of touch switching processing by the touch sensor of FIG. 1.

Now, refer back to the description of the flowchart of FIG. 4.

In step S3, the control section 11 determines whether a human body has touched the electrode E based on unknown electrostatic capacitance of the capacitor Cx supplied from the measurement section 13. More specifically, since the electrostatic capacitance of the human body is in the vicinity of 11 pF, the control section 11 can determine whether the human body has touched the electrode E by determining whether the electrostatic capacitance of the capacitor Cx supplied from the measurement section 13 is at a threshold value Cxth in the vicinity of 11 pF. That is, for example, if the threshold value Cxth is set based on the assumption that (11×0.95) pF<Cxth<(11×1.05) pF, the control section 11 determines that the human body has come in contact when the electrostatic capacitance Cx of the capacitor Cx is equal to Cxth, i.e., (11×0.95) pF<Cxth<(11×1.05) pF, and otherwise, determines that the human body has not come in contact.

For example, if having determined in step S3 that the human body has come in contact, in step S4, the control section 11 controls the output section 14 to indicate contact of the human body and the process returns to step S2.

On the other hand, if having determined in step S3 that the human body has not come in contact, in step S5, the control section 11 controls the output section 14 to indicate non-contact of the human body, and the process returns to step S2 to repeat the subsequent processing.

It is thus possible to detect unknown electrostatic capacitance of the capacitor Cx with high accuracy and with a smaller number of times of processing count, thereby recognizing the contact/non-contact of a human body accurately and speedily.

It is to be noted that since it is known beforehand that what come in contact is a human body, speedy processing is possible by setting an appropriate reference voltage Vref beforehand; in contrast, if, for example, what comes in contact has unknown electrostatic capacitance, the electrostatic capacitance may be detected coarsely while changing the reference voltage Vref over an extended time t, that is, at a low resolution, and then, based on the detected electrostatic capacitance, a reference voltage Vref close to the charging voltage Vx for the capacitor Cx may be set again, and then the capacitance may be detected with high accuracy with a shortened time t.

Although in the above-described example constitutes a touch sensor with the microcomputer 1 having three terminals of the terminals P0 to P2, for example, the functions of the terminals P0 and P1 may be unified.

That is, the touch sensor of FIG. 1 has such a circuit configuration that the switches SW1 and SW2 sandwich the resistor R as shown in FIG. 2, so that they cannot be controlled with the same terminal. However, by a circuit configuration that the switch SW1 is connected at an opposite position with respect to the resistor R as shown in FIG. 13, the switches SW1 and SW2 can be controlled with one terminal.

Figure 14:
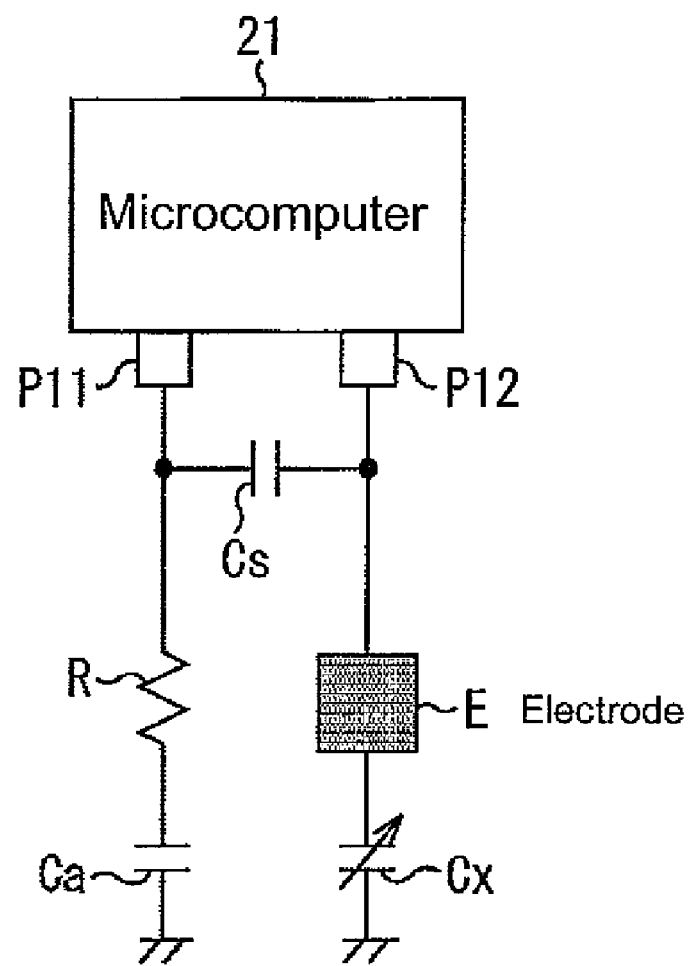
FIG. 14 shows an explanatory diagram of a constitution of the touch sensor having the circuit constitution of FIG. 13.

FIG. 14 shows such a configuration of the touch sensor that the switches SW1 and SW2 can be controlled with one terminal. A microcomputer 21 has two terminals P11 and P12. The terminal P12 has the same functions as the terminal P2 of the microcomputer 1 of FIG. 1, while the terminal P11 in FIG. 14 has combined functions of both the terminals P0 and P1 in FIG. 1. It is to be noted that the same components of FIG. 14 as those of FIG. 1 are indicated by the same symbols and description thereof will not be given as appropriate.

Figure 13:
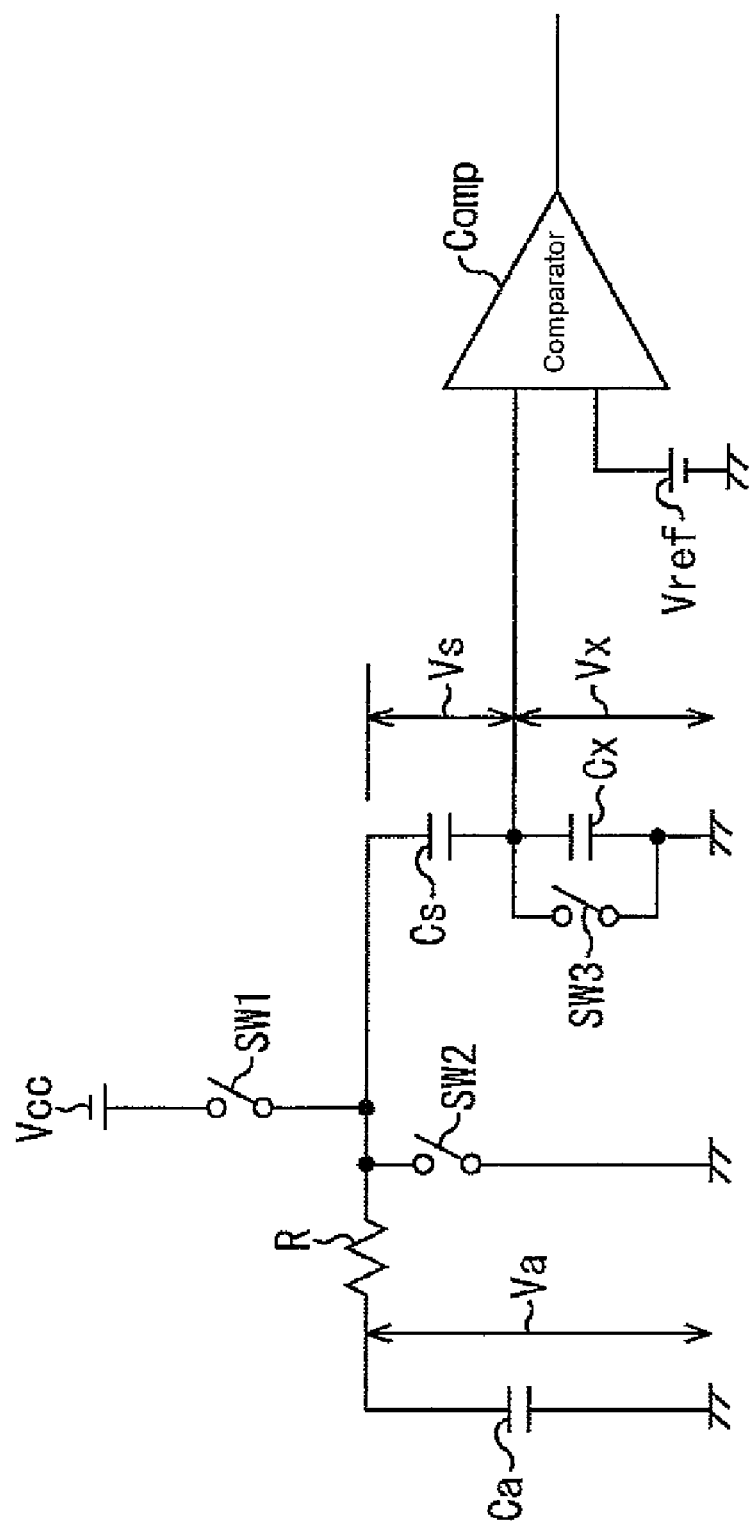
FIG. 13 shows an explanatory diagram of another constitution of the touch sensor.

If set to the Hi state by a switching section 31, the terminal P11 turns ON a switch SW1 of FIG. 13, thus charging a capacitor Ca at a supply voltage Vcc of a power supply Vcc. If set to the HiZ state by the switching section 31, the terminal P11 turns OFF switches SW1 and SW2 of FIG. 13 as well as the SW2 of FIG. 2, thus connecting the capacitor Ca and a combined capacitor of capacitors Cs and Cx in parallel. Further, if set to the Low state by the switching section 31, the terminal P11 turns ON the switch SW2 of FIG. 13, thus gradually discharging the capacitor Ca through a resistor R from the grounding point and instantaneously discharging the capacitor Cs totally. It is to be noted that the terminal P12 is similar to the terminal P2 of FIG. 1 and its description will not be given.

Next, functions realized by the microcomputer 21 of FIG. 14 will be described below with reference to FIG. 15. It is to be noted that the functions in FIG. 15 corresponding to those realized by the microcomputer 1 of FIG. 3 are indicated by the same symbols and description thereof will not be given as appropriate.

The switching section 31 basically has the same functions as the switching section 12 of FIG. 3 in that it will control the operations of the terminals P11 and P12 at predetermined intervals by referencing a built-in timer 31a. More specifically, the switching section 31 repetitively switches the operating states of the terminals P11 and P12 in a predetermined pattern cyclically at the predetermined intervals. Further, each time one cycle of the operations repeated in the predetermined pattern ends, the switching section 31 supplies the measurement section 13 with a signal to that effect.

Next, in the following description about touch switching processing by the touch sensor of FIG. 14, only measurement processing in step S2 by the touch sensor of FIG. 14 will be described with reference to the flowchart of FIG. 16 because only the measurement processing is different from that in the processing described with reference to the flowchart of FIG. 4.

Figure 16:
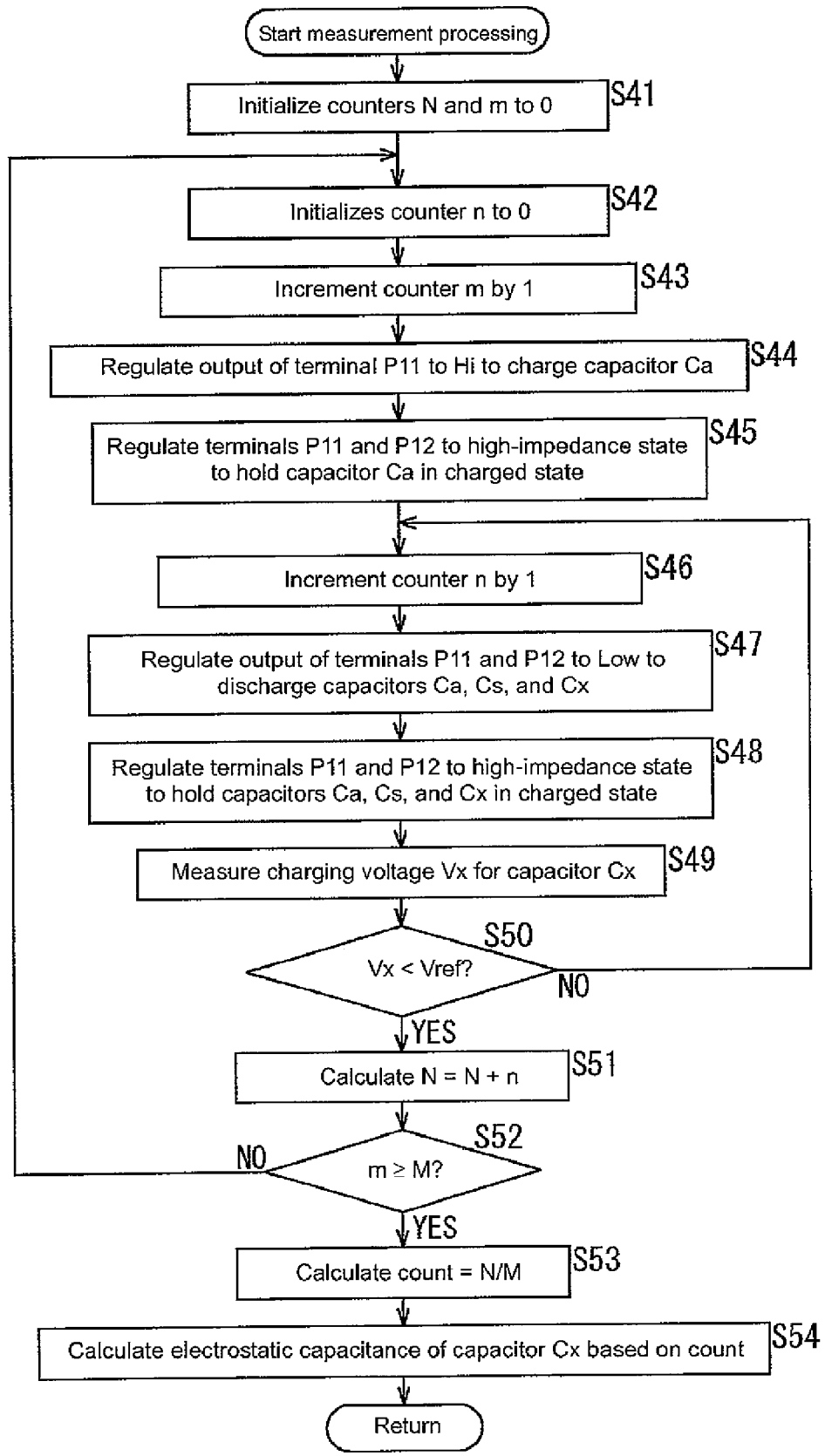
FIG. 16 shows an explanatory flowchart of measurement processing by the touch sensor of FIG. 14.

It is to be noted that processing of steps S41 to S43 and steps S49 to S54 in the flowchart of FIG. 16 is the same as that of steps S21 to S23 and steps S29 to S34 described with reference to the flowchart of FIG. 5 and description thereof will not be given.

In step S44, the switching section 31 regulates the output of the terminal P11 to Hi, thus charging the capacitor Ca with the power supply Vcc. That is, by regulating the output of the terminal P11 to Hi, the switch SW1 shown in FIG. 13 is turned ON to supply the capacitor Ca with power through the resistor R from the power supply Vcc so that the capacitor Ca is gradually charged up to the charging voltage Vcc finally.

In step S45, by regulating all of the terminals P11 and P12 to HiZ (high-impedance state) for a predetermined time based on the timer 31a, the switching section 31 holds the capacitor Ca in a charged state. That is, by regulating the terminals P11 and P12 to the HiZ state, the switches SW1 and SW3 shown in FIG. 13 are turned OFF to hold the capacitor Ca in a condition where it is charged at the charging voltage Va=Vcc.

In step S46, the counter 13a of the measurement section 13 increments a counter n by 1.

In step S47, the switching section 31 regulates the terminals P11 and P12 to Low for a predetermined time t based on the timer 31a, thereby discharging the capacitors Ca, Cs, and Cx. In this case, the capacitors Cs and Cx are discharged through the ground instantaneously, whereas the capacitor Ca is discharged by the switch SW2 through the resistor R to the ground gradually, and therefore, will be discharged only partly within a predetermined time t.

In step S48, the switching section 31 regulates the terminals P11 and P12 to the HiZ state for a predetermined time t based on the timer 31a to transfer charges in the capacitor Ca (charges left in a condition where the charges are partly discharged by the processing of step S47) to the capacitors Cs and Cx, thereby holding the capacitors Ca, Cs, and Cx in a charged state. In this case, since the capacitor Ca and the combined capacitor of the capacitors Cs and Cx are formed into a parallel circuit, the charging voltage Va for the capacitor Ca is equal to a sum of the charging voltages Vs and Vx for each capacitor Cs and Cx. Further, the ratio between the charging voltages Vs and Vx for the capacitors Cs and Cx is that between the reciprocals of capacitance values of the capacitors Cs and Cx.

As a result, through the processing of step S44, the first step processing in FIG. 17 is performed, that is, the switch SW1 in FIG. 13 is turned ON. This processing only charges the capacitor Ca, so that the switch SW2 is turned OFF and the switch SW3 may be either turned ON or OFF. As a result, as shown in the left half of FIG. 18, through the processing of the first step of FIG. 17, the terminal P11 is regulated to Hi at time t0 to turn ON the switch SW1 of FIG. 13, thereby charging the capacitor Ca at the charging voltage Va=Vcc. However, as can be seen from comparison with FIG. 7, in the touch sensor of FIG. 1, the charging voltage Va for the capacitor Ca reaches Vcc at the same time as the switch SW1 is turned ON, whereas in the touch sensor in FIG. 14, as shown in FIG. 18, power of the power supply Vcc is supplied to the capacitor Ca through the resistor R, so that it takes some time to charge the capacitor.

Figure 18:
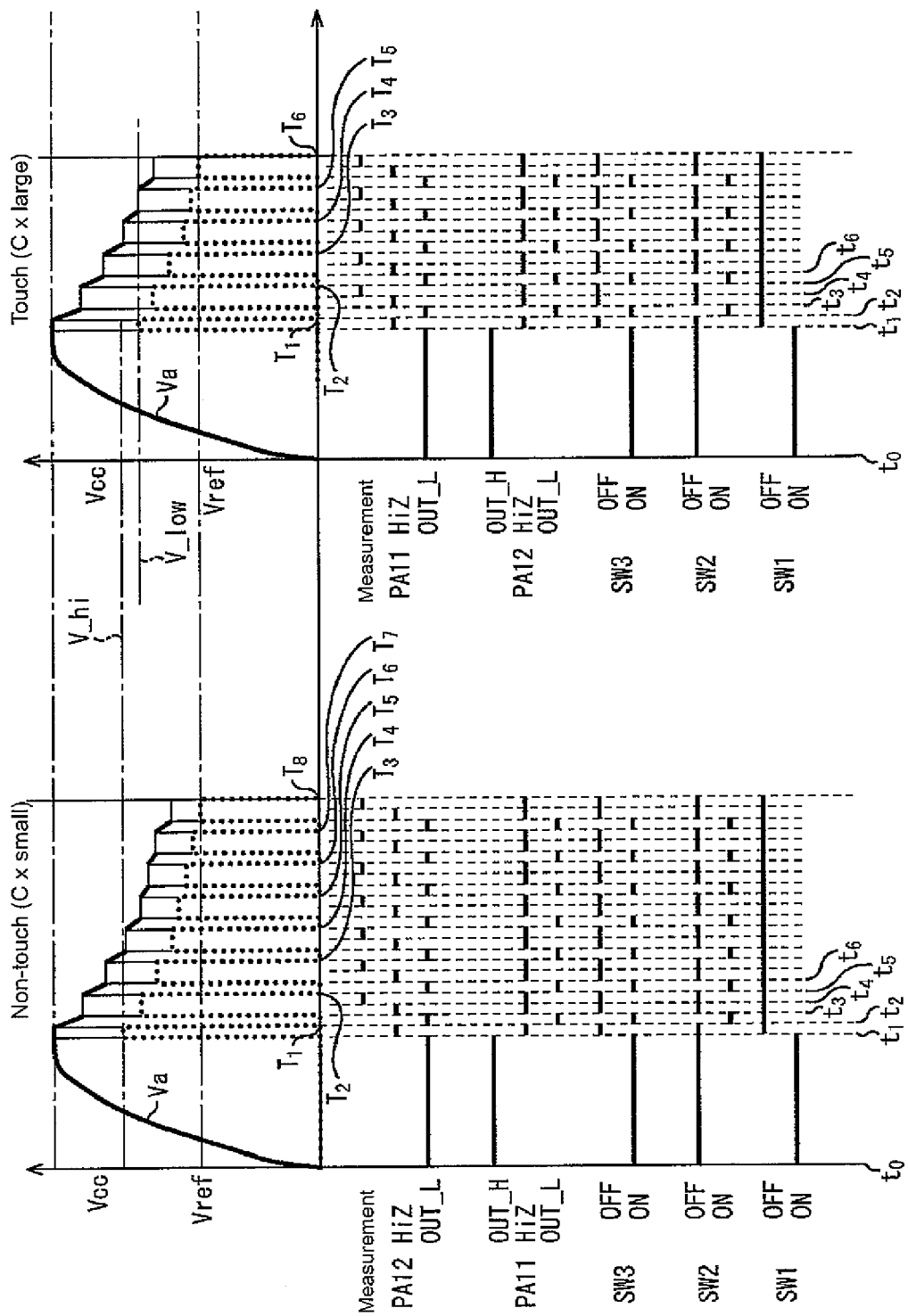
FIG. 18 shows an explanatory timing chart of the measurement processing by the touch sensor of FIG. 14.

It is to be noted that in FIG. 18, in an upper-part graph, a bold solid line indicates the charging voltage Va for the capacitor Ca, and a dotted line indicates the charging voltage for the capacitor Cx. Further, below it, the operation state of the terminal P12 is shown for measuring the capacitor Cx by the measurement section 13 through the terminal P12, in which HiZ indicates a high-impedance state, that is, a state where the terminal P12 is providing no output and OUT_L indicates a state where it is set to Low.

Below the terminal P12, the operation state of the terminal P11 is shown, in which Hi indicates a state where the capacitor Ca is supplied with power through the terminal P11 from the power supply Vcc and being charged at the charging voltage Vcc. HiZ indicates a high-impedance state, that is, a state where the terminal P11 is providing no output, and OUT_L indicates a state where it is set to Low.

Further below it, the operation states of the switches SW3 to SW1 are shown respectively. It is to be noted that the switch SW1 operates in conjunction with the terminal P11 such that the switch SW1 is turned ON when the terminal P11 is set to Hi, and that the switch SW1 is turned OFF when the terminal P11 is in the HiZ state, and when the terminal P11 is set to Low, the switch SW2 is turned ON. It is thus possible to control the switches SW1 and SW2 by using only the terminal P11. The switch SW3 operates in conjunction with the terminal P12 such that the switch SW3 is turned ON only when the terminal P12 is set to Low, and otherwise, in the OFF state.

Further, in the processing of step S45, the processing of the second step of FIG. 17 is performed, that is, the switches SW1 and SW2 of FIG. 13 are turned OFF. As a result, through the processing of the second step of FIG. 17, as shown by the left half of FIG. 18, at time t1, the terminals P11 and P12 are regulated to HiZ to turn OFF the switches SW1 to SW3 of FIG. 13, thereby holding the capacitor Ca in a condition where it has been charged at the charging voltage Va=Vcc.

In the processing of step S47, the processing of the third step of FIG. 17 is performed, that is, the switch SW1 of FIG. 13 is turned OFF and the switches SW2 and SW3 are turned ON. As a result, through the processing of the third step of FIG. 17, as shown by the left half of FIG. 17, at time t2, the terminal P11 is regulated to Low to turn ON the switches SW2 and SW3 of FIG. 13, thereby discharging the capacitors Cx and Cs totally and gradually discharging the capacitor Ca through the resistor R.

Further, in the processing of step S48, the processing of the fourth step of FIG. 17 is performed, that is, the switches SW1 to SW3 of FIG. 13 are turned OFF. As a result, at time t3, the capacitor Ca is partly discharged through the resistor R between time t2 and time t3 and then charges still left in the capacitor Ca causes the capacitors Ca, Cs, and Cx to be held in a charged state. That is, as the capacitor Ca is partly discharged between time t2 and time t3, the charging voltage Va for the capacitor Ca decreases as shown in FIG. 18. Therefore, as described above, if the switches SW1 and SW2 are turned OFF through the processing of the first step of FIG. 17, a charging voltage Vx=V_hi applied on the capacitor Cx is also reduced correspondingly. However, the ratio between the respective charging voltages Vs and Vx for the capacitors Cs and Cx is kept constant.

In the processing of step S49, the processing of the fifth step of FIG. 17 is performed. That is, if a value of the charging voltage Vx for the capacitor Cx measured by the measurement section 13 through the terminal P12 at time t4 in a condition where the switches SW1 to SW3 of FIG. 13 are in the OFF state is not smaller than a reference voltage Vref, the processing of steps S46 to S50, that is, the processing of the third through fifth steps of FIG. 17 will be repeated.

As a result, similar to that of FIG. 1, the touch sensor of FIG. 14 not only can detect contact/non-contact of a human body speedily and accurately but also has only two terminals to be controlled by the microcomputer 21, thereby reducing the manufacturing costs.

It is to be noted that, as shown in FIG. 18, the touch sensor of FIG. 14 is similar to that of FIG. 1 in that the processing needs to be repeated a smaller number of times as the charging voltage Vx for the capacitor Cx at the time when the charging voltage Va for capacitor the Ca is Va=Vcc gets closer to the reference voltage Vref. That is, in the left half of FIG. 18, the charging voltage Vx for the capacitor Cx is V_hi against the charging voltage Va for the capacitor Ca of Va=Vcc and has reached the reference voltage Vref against a number of times of repetitive processing of seven, whereas in the right half of FIG. 18, the charging voltage Vx for the capacitor Cx is V_low (<V_hi) against the charging voltage Va for the capacitor Ca of Va=Vcc and has reached the reference voltage Vref against a number of times of repetitive processing of five, thus indicating that the value of the charging voltage Vx for the capacitor Cx against the charging voltage Va for the capacitor Ca of Va=Vcc is smaller than the other and the number of times of repetitive processing becomes smaller as the value gets closer to the reference voltage Vref.

Although in the above, an example has been described of determining whether a human body has come in contact (through an insulator) by using one electrode E, a plurality of configurations of the touch sensor in FIG. 14 may be provided so that contact/non-contact of a human body may be detected at a plurality of positions by using a plurality of electrodes.

Figure 19:
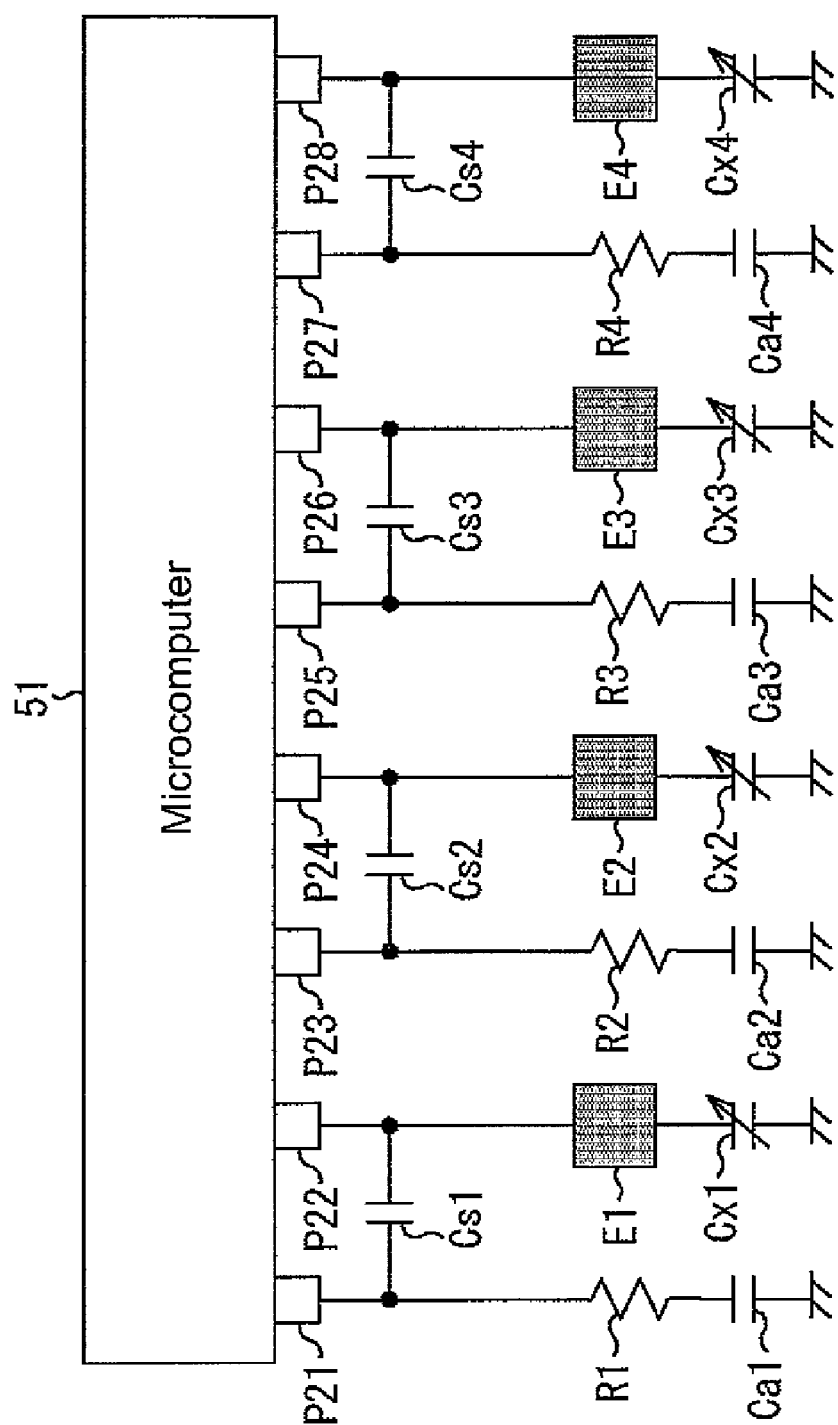
FIG. 19 shows an explanatory diagram of another constitution of the touch sensor.

For example, as shown in FIG. 19, four configurations each of which includes four electrodes E1 to E4 may be disposed in parallel for detection. It is to be noted that in FIG. 19, capacitors Ca1 to Ca4 correspond to the capacitor Ca in FIG. 14, capacitors Cs1 to Cs4 correspond to the capacitor Cs in FIG. 14, capacitors Cx1 to Cx4 correspond to the capacitor Cx in FIG. 14, resistors R1 to R4 correspond to the resistor R in FIG. 14, and electrodes E1 to E4 correspond to the electrode E in FIG. 14, which are identical to each other respectively. Further, the corresponding microcomputer 51 is provided with eight terminals of terminals P21 to P28, of which terminals P21, P23, P25, and P27 correspond to the terminal 11, and terminals P22, P24, P26, and P28 correspond to the terminal 12, which are identical to each other respectively. The microcomputer 51 measures contact/non-contact of a human body on the electrode E1 by using the terminals P21 and P22, on the electrode E2 by using the terminals P23 and P24, on the electrode E3 by using the terminals P25 and P26, and on the electrode E4 by using the terminals P27 and P28.

However, the microcomputer 51 does not simultaneously measure the charging voltages Vx1 to Vc4 for the capacitors Cx1 to Cx4 at the terminals P22, P24, P26, and P28 respectively, but, for example, measures contact/non-contact of a human body on the electrode E1 by using the terminals P21 and P22, on the electrode E2 by using the terminals P23 and P24, on the electrode E3 by using the terminals P25 and P26, and on the electrode E4 by using the terminals P27 and P28 in this order. By repeating this processing sequentially contact/non-contact of a human body on the electrodes E1 to E4 is detected sequentially.

In this case, as described above, the capacitors Ca1 to Ca4 take a longer time to be charged owing to the respective resistors R1 to R4, so that if they start to be charged after their capacitance values are obtained, a charge waiting time occurs, thus possibly taking too long processing time.

Figure 20:
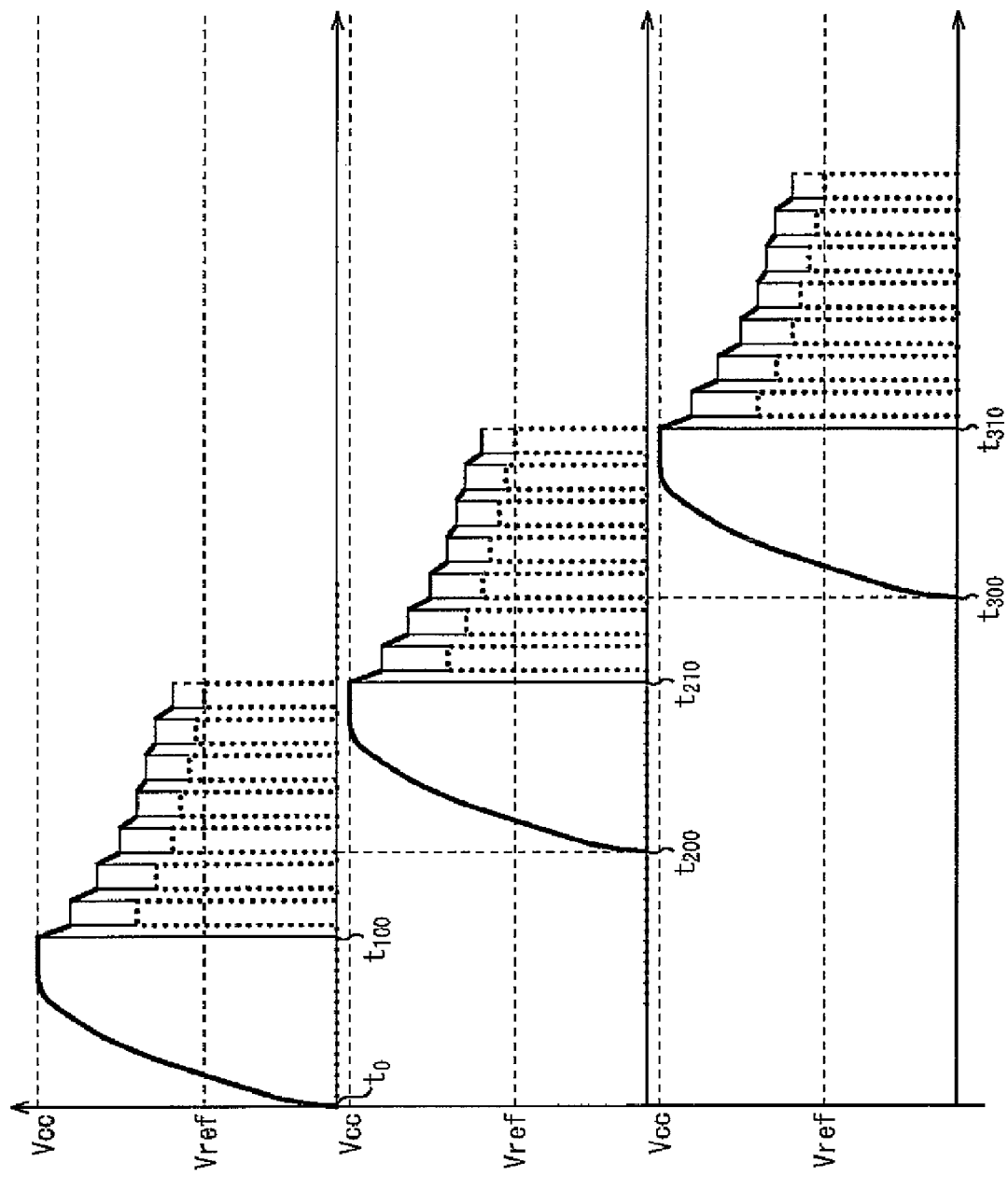
FIG. 20 shows an explanatory chart of operations of the touch sensor of FIG. 19.

To solve this problem, as shown in FIG. 20, when electrostatic capacitance is being calculated, the capacitor Ca whose electrostatic capacitance is to be calculated next may start to be charged. That is, for example, as shown in an upper part of FIG. 20, the microcomputer 51 charges the capacitor Ca1 using the terminals P21 and P22 between times T0 and T100 and starts processing to repeat the processing of the third through fifth steps in FIG. 17 at time T100. In this case, after time t100, immediately after starting the processing to repeat the processing of the third through fifth steps in FIG. 17, to obtain electrostatic capacitance of the capacitor Cx2 as shown by a middle part of FIG. 20, the microcomputer 51 starts charging the capacitor Ca2 using the terminals P23 and P24 at, for example, time t200. Then, the capacitor Ca2 has been charged completely at time t210 when electrostatic capacitance of the capacitor Cx1 was obtained, so that the microcomputer 51 starts the processing to repeat the processing of the third through fifth steps in FIG. 17 to obtain electrostatic capacitance of the capacitor Cx2. Similarly, immediately after starting the processing to repeat the processing of the third through fifth steps in FIG. 17, to obtain electrostatic capacitance of the capacitor Cx3, the microcomputer 51 starts charging the capacitor Ca3 using the terminals P25 and P26 at, for example, time t300. Then, the capacitor Ca3 has been charged completely at time t310 when electrostatic capacitance of the capacitor Cx2 was obtained, so that the microcomputer 51 starts the processing to repeat the processing of the third through fifth steps in FIG. 17 to obtain electrostatic capacitance of the capacitor Cx3.

In such a manner, to obtain electrostatic capacitance of the capacitors Cx1 to Cx4, at a timing immediately after starting the processing to repeat the processing of the third through fifth steps in FIG. 17, the capacitors Ca1 to Ca4 corresponding to the electrodes to be processed next are charged to reduce the waiting time due to charging, thereby speedily detecting contact/non-contact of a human body with high accuracy even in the case of the detection of the human body contact/non-contact at a plurality of positions.

Further, as described above, even in the case of a plurality of terminals, the microcomputer does not perform processing by use of three terminals or more at a time. Moreover, the capacitor Ca and the resistor R are only charged first and then discharged by the repetitive processing, so that they may be connected in parallel with a plurality of capacitors Cs and Cx and the electrode E. Therefore, for example, as shown in FIG. 21, to a terminal P32 including a capacitor Ca1 and a resistor R1, each of terminal P31 including a capacitors Cs1 and Cx1 to detect human body contact/non-contact at an electrode E1 and terminal P33 including capacitors Cs2 and Cx2 to detect human body contact/non-contact at an electrode E2 may be connected in parallel, and further, to a terminal P35 including a capacitor Ca2 and a resistor R2, each of terminal P34 including capacitors Cs3 and Cx3 to detect human body contact/non-contact at an electrode E3 and terminal P36 including capacitors Cs4 and Cx4 to detect human body contact/non-contact at an electrode E4 may be connected in parallel.

Figure 21:
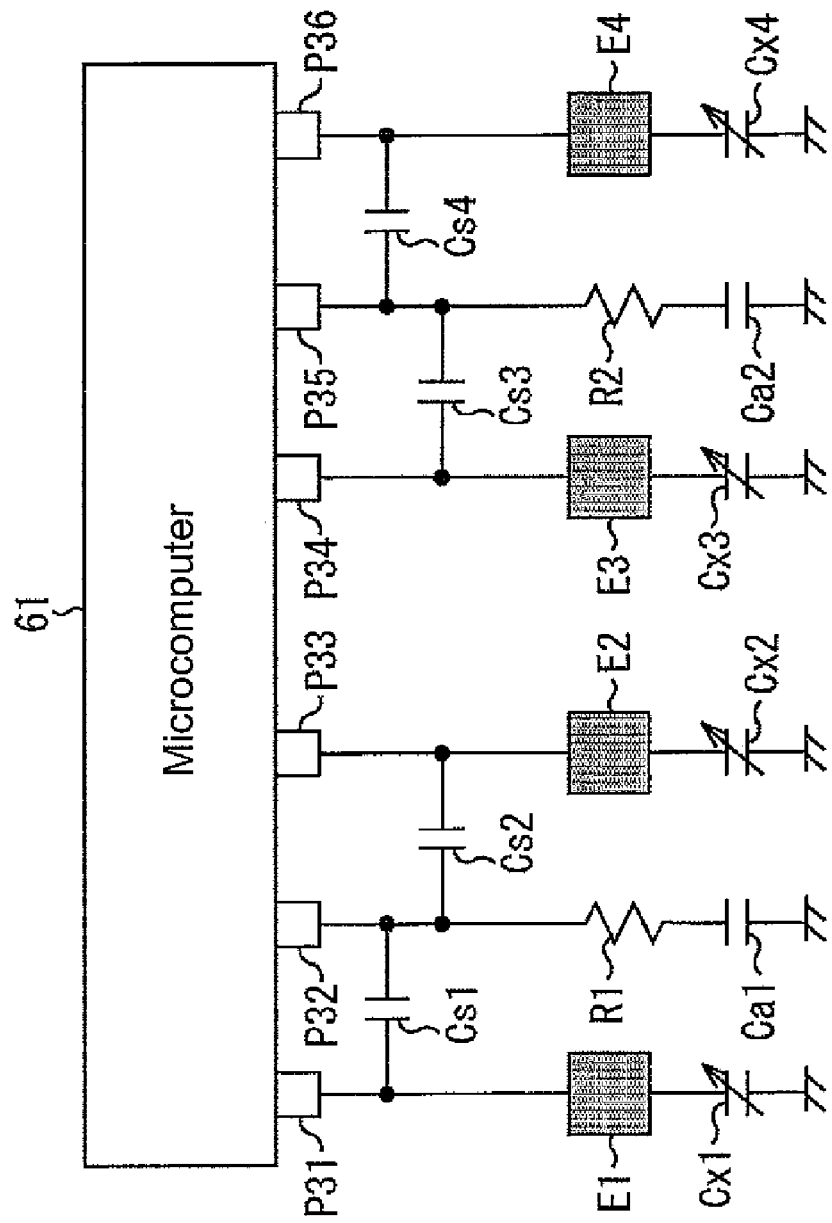
FIG. 21 shows an explanatory diagram of still another constitution of the touch sensor.

In the case of a touch sensor of FIG. 21, a microcomputer 61 measures human body contact/non-contact on the electrode E1 by controlling the terminals P31 and P32, on the electrode E2 by controlling the terminals P32 and P33, on the electrode E3 by controlling the terminals P34 and P35, and on the electrode E4 by controlling the terminals P35 and P36.

As a result, the microcomputer 61 can control a touch sensor that detects human body contact/non-contact at four positions by using six terminals, thus reducing the costs for manufacturing the touch sensor.

Figure 22:
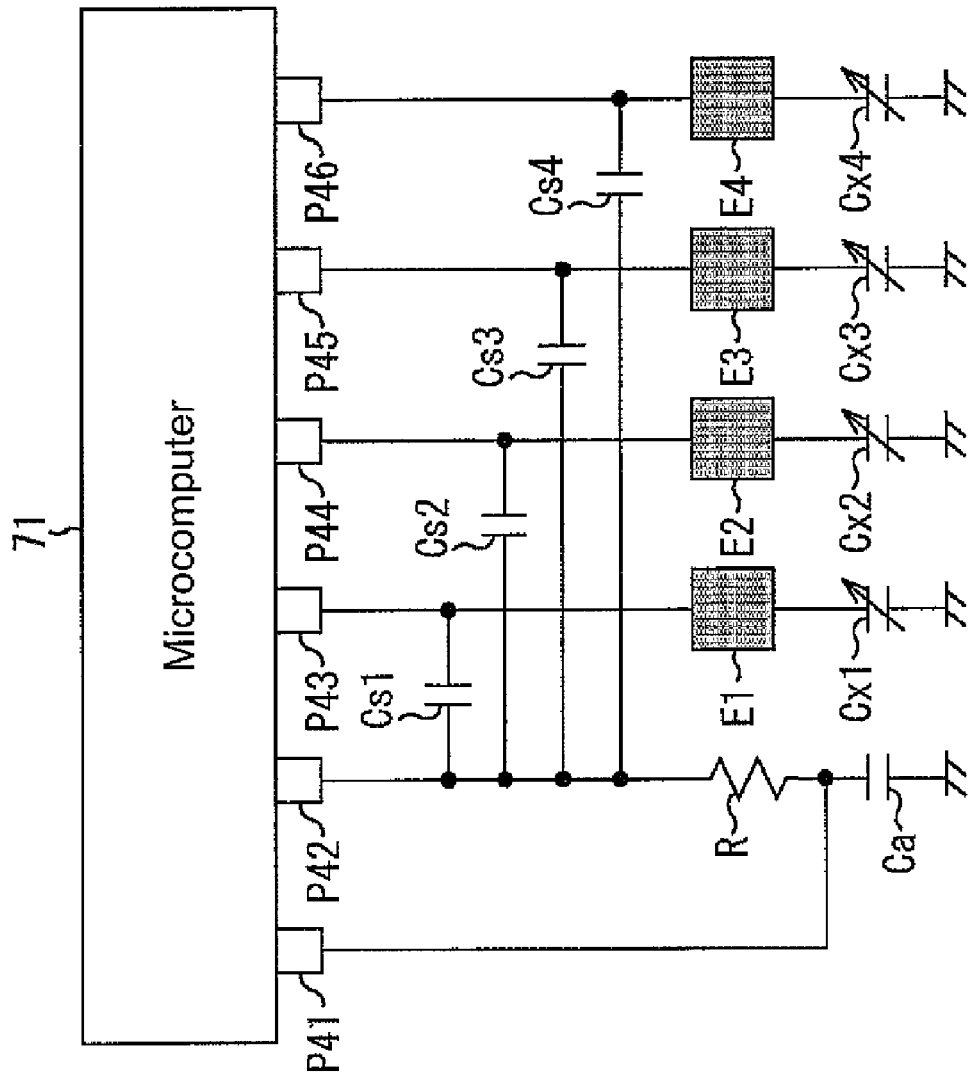
FIG. 22 shows an explanatory diagram of still another constitution of the touch sensor.

Moreover, besides the touch sensor configuration shown in FIG. 14, for example, such a touch sensor configuration as shown in FIG. 1 as well as such as shown in FIG. 22 may be employed to realize the above-described touch sensor that detects human body contact/non-contact at a plurality of positions. A touch sensor of FIG. 22 includes a terminal P41 that corresponds to the terminal P0 in FIG. 1, a terminal 42 that corresponds to the terminal P1 in FIG. 1, a resistor R, and a capacitor Ca in such a configuration that four terminals each corresponding to the terminal P2 are disposed in parallel. That is, to a terminal P43 are connected capacitors Cs1 and Cx1 to detect human body contact/non-contact on an electrode E1, to a terminal P44 are connected capacitors Cs2 and Cx2 to detect human body contact/non-contact on an electrode E2, to a terminal P45 are connected capacitors Cs3 and Cx3 to detect human body contact/non-contact on an electrode E3, and to a terminal P46 are connected capacitors Cs4 and Cx4 to detect human body contact/non-contact on an electrode E4.

In the case of the touch sensor of FIG. 22, a microcomputer 71 measures human body contact/non-contact on the electrode E1 by controlling the terminals P41 to P43, on the electrode E2 by controlling the terminals P41, P42, and P44, on the electrode E3 by controlling the terminals P41, P42, and P45, and on the electrode E4 by controlling the terminals P41, P42, and P46.

With this configuration, as a result, the microcomputer 71 can control a touch sensor that detects human body contact/non-contact at four positions by using six terminals.

In the above-described example of charging the capacitors Ca1 to Ca4 through the resistors R1 to R4, a charging time is delayed due to charging through the resistors R1 to R4. To solve this problem, such a configuration may be provided as to charge the capacitors Ca1 to Ca4 not through the resistors R1 to R4, thereby reducing the charging time.

Figure 23:
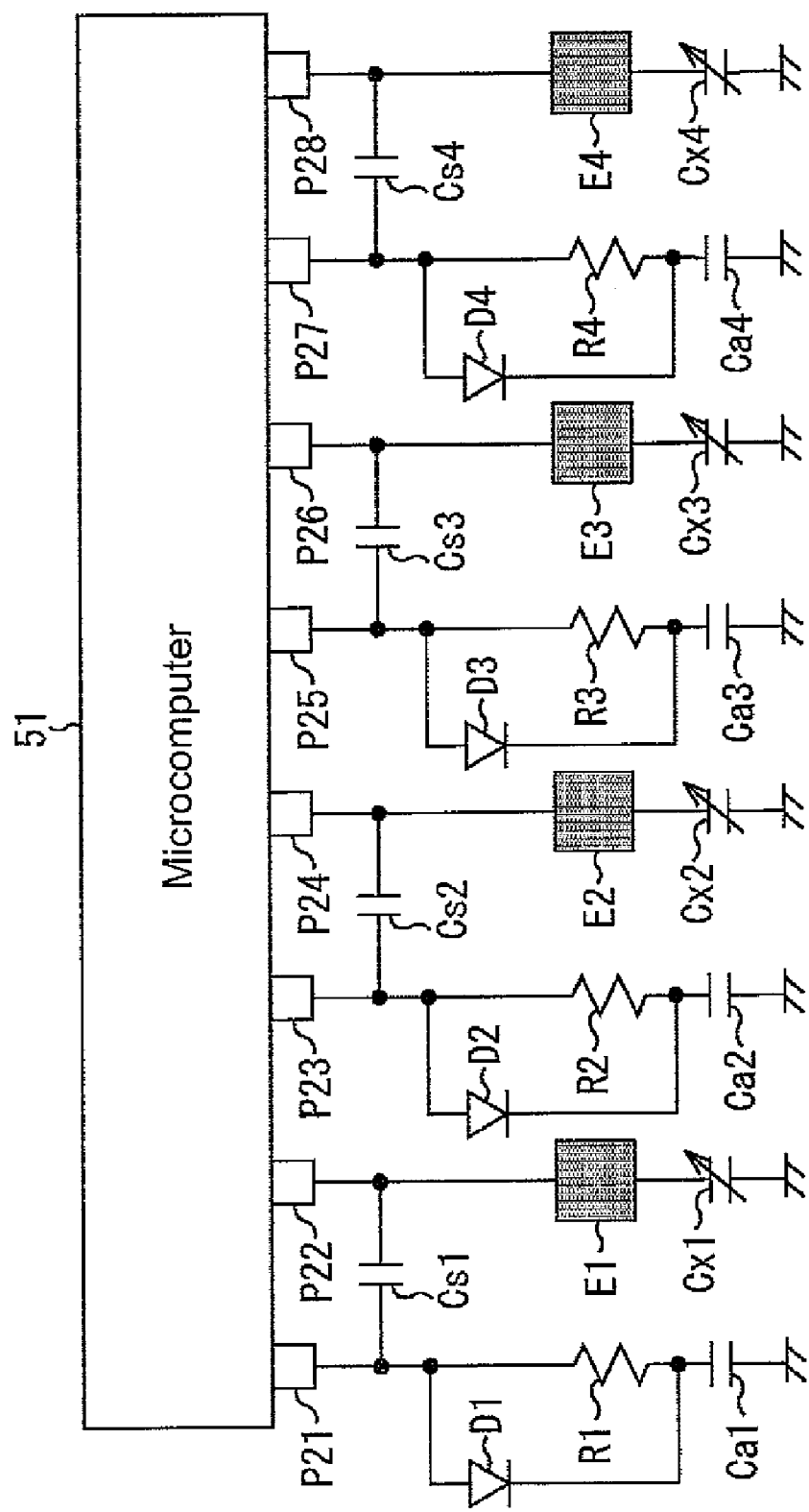
FIG. 23 shows an explanatory diagram of still another constitution of the touch sensor.

For example, as shown in FIG. 23, by connecting a diode D1 in a forward direction toward a capacitor Ca1 and in parallel with a resistor R1 (connecting the anode of the diode D1 to a node between the capacitor Ca1 and the resistor R1 and the cathode to a node between a terminal P21 and the resistor R1), the capacitor Ca1 is charged through the diode D1, thus enabling speedy completion of charging more than the case of charging through the resistor R1. Similarly, by connecting diodes D2 to D4 in parallel with resistors R2 to R4 and in a forward direction toward capacitors Ca2 to Ca4, the time required to charge the capacitors Ca2 to Ca4 can be reduced. It is to be noted that in the touch sensor of FIG. 23, the same components as those in the touch sensor of FIG. 19 are indicated by the same symbols and description thereof will not be given as appropriate. Also, the operations of the touch sensor of FIG. 23 are the same as those of the touch sensor of FIG. 19 other than the reduced charging time for the capacitors Ca1 to Ca4, and description thereof will not be given also.

Figure 24:
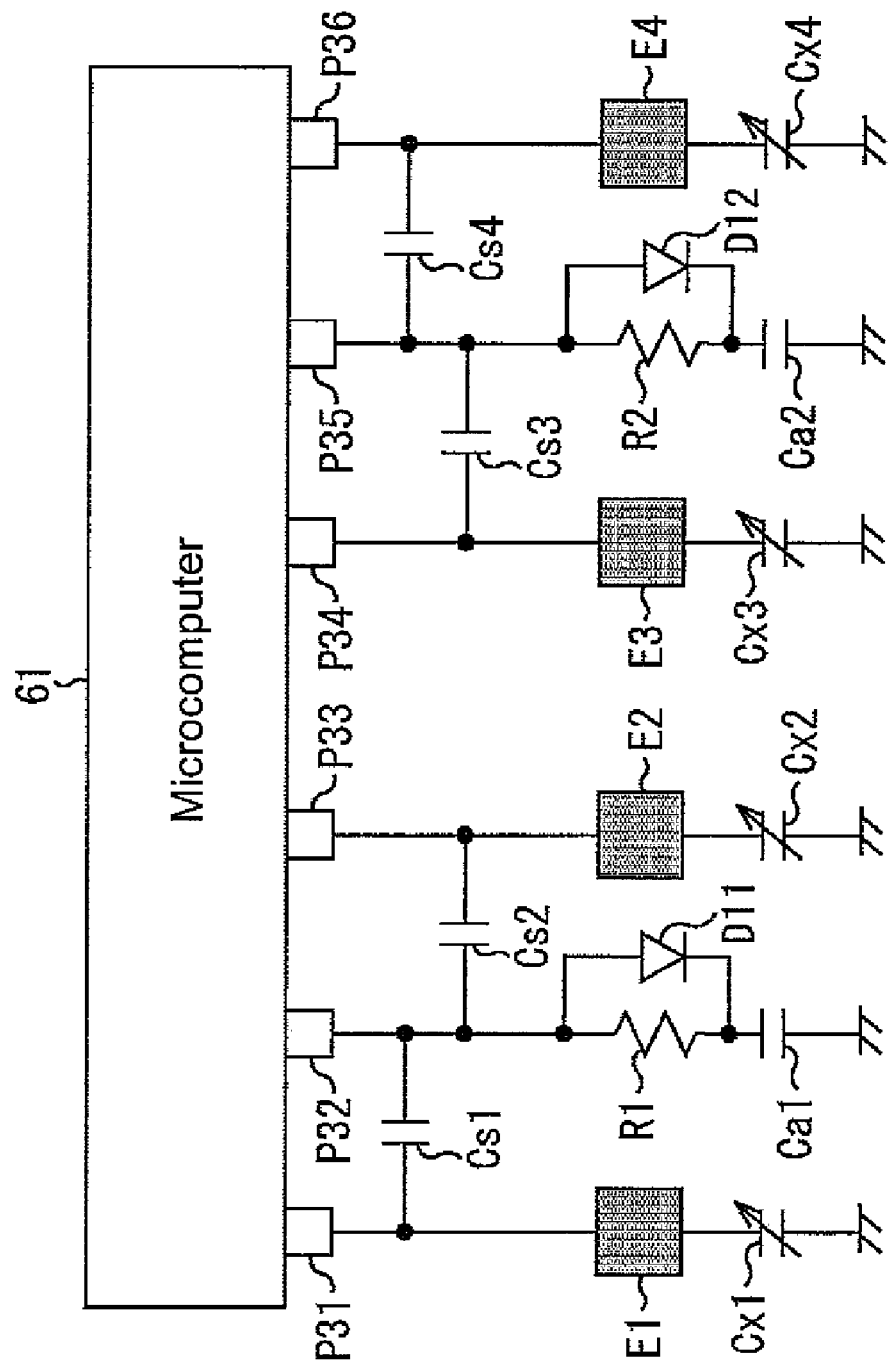
FIG. 24 shows an explanatory diagram of even another constitution of the touch sensor.

Further, similarly, as shown in FIG. 24, by connecting the diodes D11 and D12 in parallel with the resistors R1 and R2 and in a forward direction toward the capacitors Ca1 and Ca2, the charging time for the capacitors Ca1 and Ca2 may be reduced.

Figure 25:
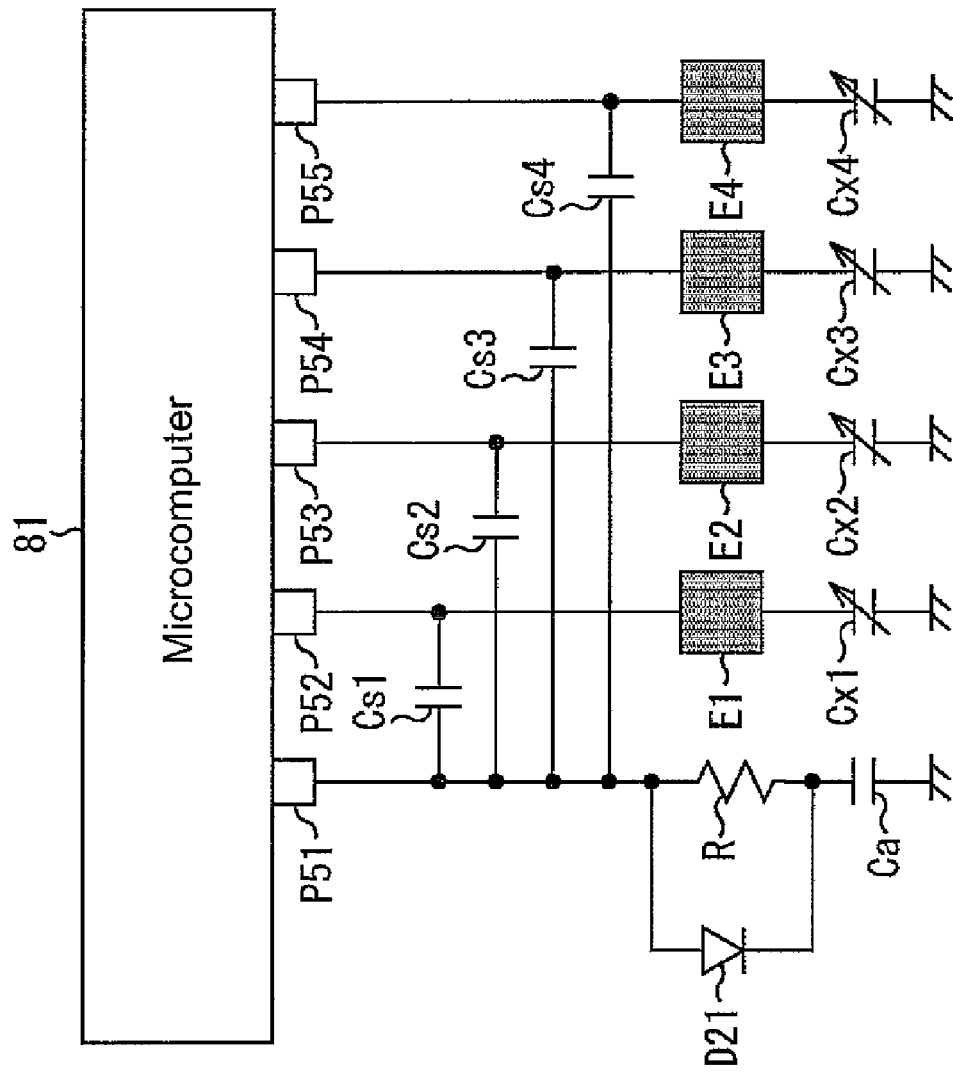
FIG. 25 shows an explanatory diagram of even another constitution of the touch sensor.

Further, if the switches SW1 and SW2 are to be controlled using one terminal as shown in the touch sensor of FIG. 14, the touch sensor of FIG. 22 will take such a touch sensor configuration as shown in FIG. 25. In this case, by connecting a diode D21 in parallel with a resistor R and in a forward direction toward a capacitor Ca, it is possible to reduce the number of terminals from six to five and decrease the charging time for the capacitor Ca. The touch sensor of FIG. 25 is different from that of FIG. 22 in that a microcomputer 81 is substituted for the microcomputer 71, and that the diode D21 is disposed in parallel with the resistor R.

That is, in the touch sensor of FIG. 25, the necessity of the terminal P41 is eliminated in contrast to the case of FIG. 22, so that the microcomputer 81 can measure capacitance of capacitors Cx1 to Cx4 by using five terminals of P51 to P55. It is to be noted that processing to measure the capacitance of each of the capacitors Cx1 to Cx4 by using the touch sensor of FIG. 25 only repeats measurement processing by the touch sensor of FIG. 14 four times, and the description of its operations will not be given.

Such a touch sensor as shown in FIG. 25 can reduce the charging time and so speedily measure the capacitance of the capacitors Cx1 to Cx4 and also decrease the number of components by decreasing the number of the terminals, thereby reducing the costs for manufacturing.

Further, although in the above-described example, capacitors Cs1 to Cs4 having known capacitance are provided to measure the capacitance of the capacitors Cx1 to Cx4, measurement processing is performed on the capacitors Cx1 to Cx4 independently of each other, so that a common capacitor with known capacitance may be provided and used by switching it at the timing of the measurement processing of each of the capacitors Cx1 to Cx4.

Figure 26:
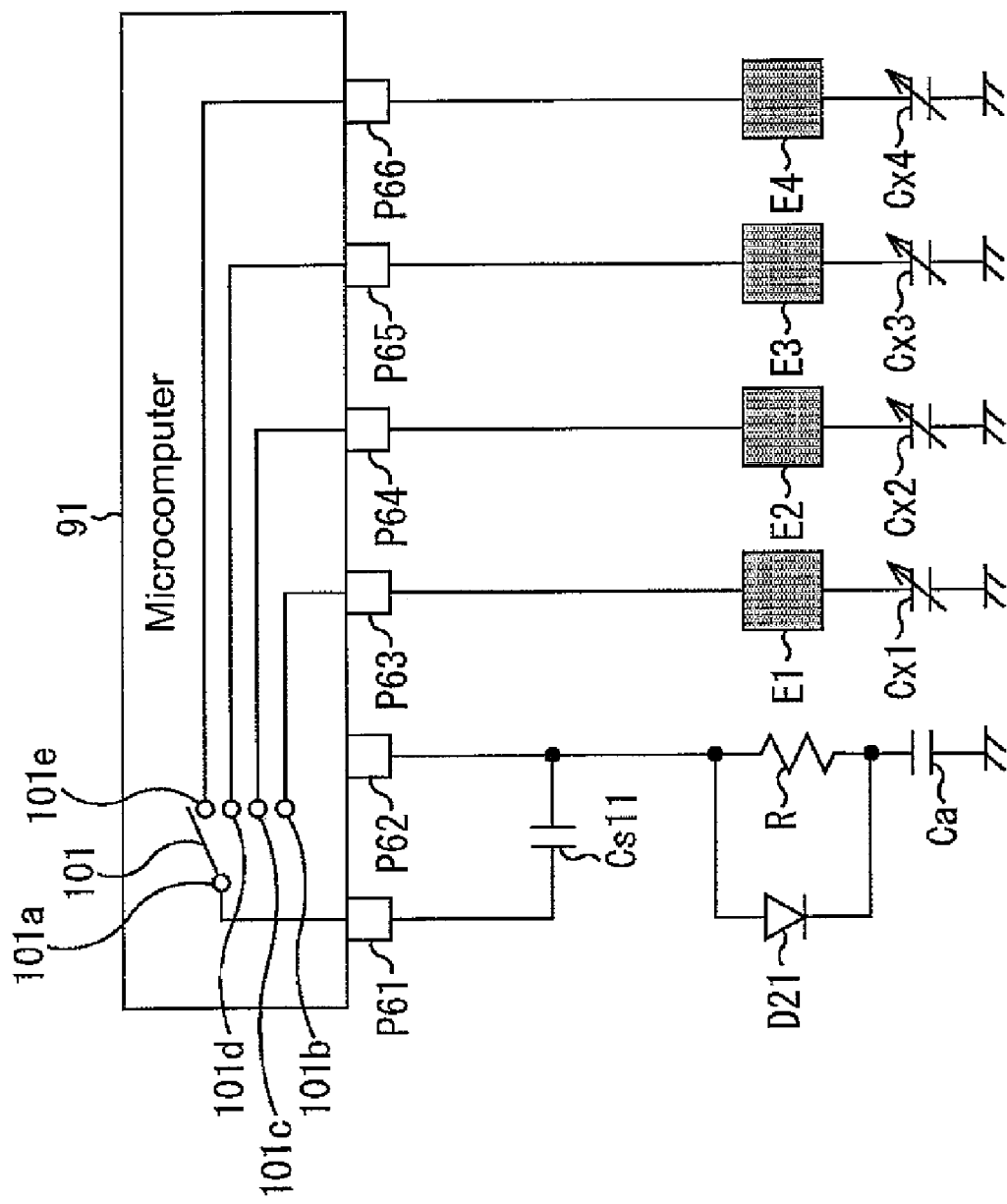
FIG. 26 shows an explanatory diagram even another constitution of the touch sensor.

FIG. 26 shows a configuration example of an embodiment of the touch sensor in which a common capacitor with known capacitance is provided and used by switching it at the timing of measurement processing of each of capacitors Cx1 to Cx4. It is to be noted that in the touch sensor of FIG. 26, components similar to those of the touch sensor of FIG. 25 are indicated by the same symbols, and description thereof will not be given as appropriate.

The touch sensor of FIG. 26 is different from that of FIG. 25 in that a microcomputer 91 is substituted for the microcomputer 81, a capacitor Cs11 is substituted for the capacitors Cs1 to Cs4, and the microcomputer 91 realizes a switch section 101. The switch section 101 has a first end thereof connected to a terminal 101a connected to a terminal P61 and a second end thereof switched to any of terminals 101b to 101e. The terminals 101b to 101e of the switch section 101 are connected to terminals P63 to P66 of the microcomputer 91 respectively. The capacitor Cs11 has a first end thereof connected to the terminal P61 and a second end thereof connected to a terminal P62. It is to be noted that the switch section 101 is a function realized by the microcomputer 91 and not actually provided as hardware.

That is, when measuring electrostatic capacitance of the capacitor Cx1, the microcomputer 91 connects the switch section 101 to the terminal 101b to use the capacitor Cs11 in place of the capacitor Cs1 in FIG. 25, thereby measuring the electrostatic capacitance of the capacitor Cx1. Also, similarly when measuring electrostatic capacitance of the capacitors Cx2 to Cs4, the microcomputer 91 connects the switch section 101 to the terminals 101c to 101e to use the capacitor Cs11 in place of the capacitor Cs2 to Cs4 in FIG. 25, thereby measuring the electrostatic capacitance of the capacitors Cx2 to Cx4, respectively.

In such a configuration, any number of target capacitors including the capacitors Cx1 to Cx4 can be measured as long as there is one capacitor Cs having known capacitance, to decrease the number of components, thereby reducing the costs.

In the above-described example where electrostatic capacitance of the capacitors Cx1 to Cx4 are measured to detect contact/non-contact of a human body on a plurality of electrodes E1 to E4, in a case where, for example, operation buttons are constituted of the electrodes E1 to E4 respectively, if the electrodes E1 to E4 are disposed close to one another one of the operation buttons to be operated may be touched together with its adjacent one to touch at least two of the electrodes at a time, in which case the electrostatic capacitance of the capacitors Cx1 to Cx4 may vary, thus resulting in erroneous detection.

To solve this problem, erroneous detection may be reduced by adjusting threshold values Cx1th to Cx4th over which human body contact on the electrodes E1 to E4 is detected, based on the electrostatic capacitance of the plurality of capacitors Cx1 to Cx4, respectively.

Figure 27:
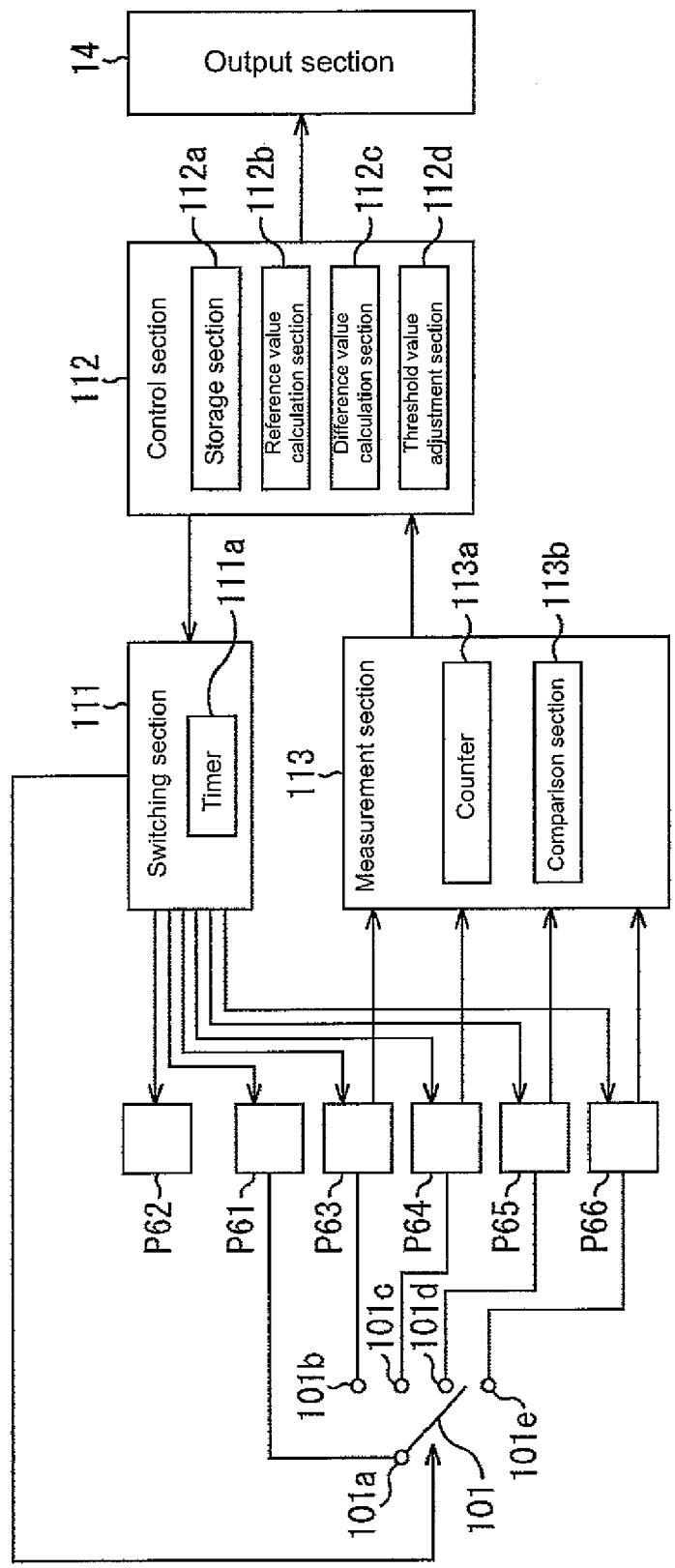
FIG. 27 shows an explanatory diagram of functions which are realized by a microcomputer of FIG. 26.

FIG. 27 shows a constitution example of functions which are realized by the microcomputer 91 in the touch sensor of FIG. 26 in which the threshold values Cx1th to Cx4th over which human body contact on the electrodes E1 to E4 is detected are adjusted based on the electrostatic capacitance of the plurality of capacitors Cx1 to Cx4, respectively. It is to be noted that in FIG. 27, the functions similar to those shown in FIG. 15 are indicated by the same symbols and description thereof will not be given as appropriate.

Figure 15:
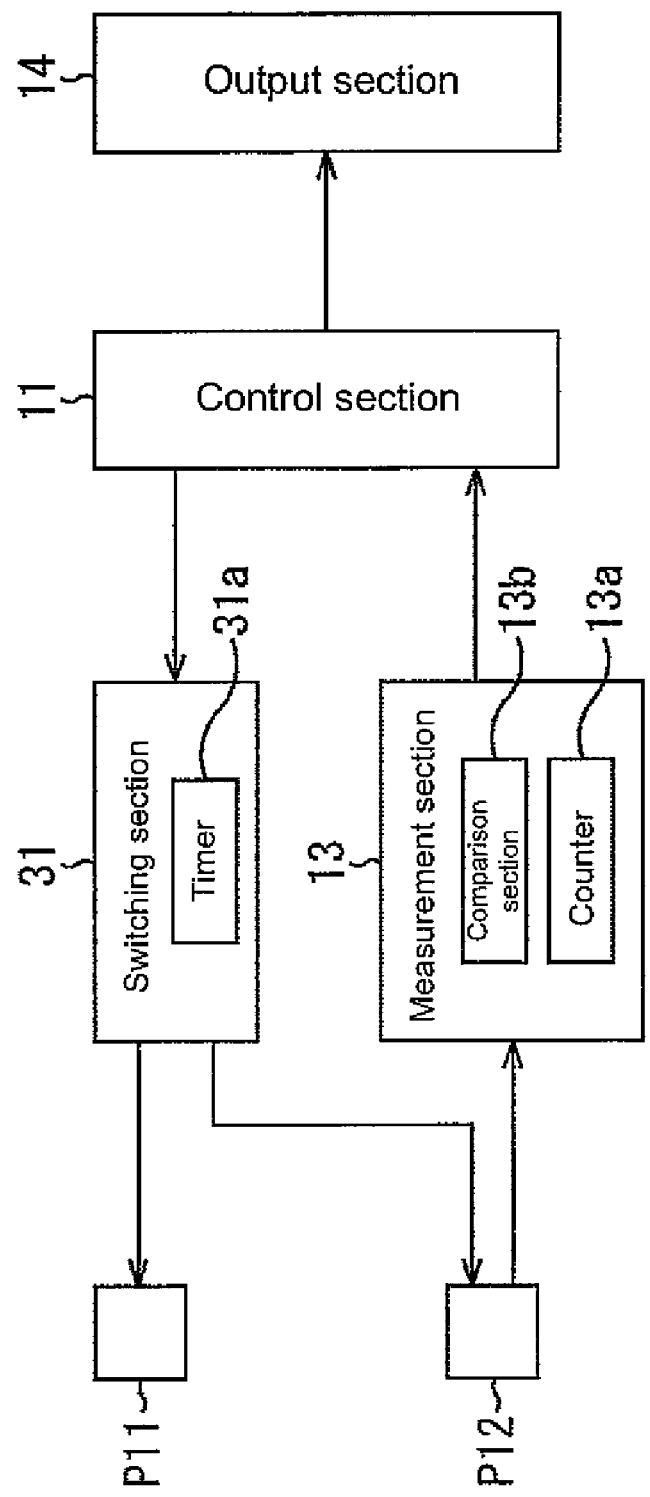
FIG. 15 shows an explanatory diagram of functions which are realized by a microcomputer of FIG. 14.

FIG. 27 is different from FIG. 15 in that a switching section 111, a control section 112, and a measurement section 113 are substituted for the control section 11, the measurement section 13, and the switching section 31. When controlled in operation by the control section 112, the switching section 111 switches the operations of terminals P61 to P66 in accordance with the operations of a timer 111a and also controls the operations of a switch section 101. The measurement section 113, which realizes substantially the same functions as the measurement section 13, measures electrostatic capacitance values of the respective capacitors Cx1 to Cx4 corresponding to the electrodes E1 to E4 based on output signals from the terminals P61 and P63 to P66 and supplies results of the measurement to the control section 112.

The control section 112 realizes basically the same functions as the control section 11, including a storage section 112a, a reference value calculation section 112b, a difference calculation section 112c, and a threshold value adjustment section 112d. The control section 112 detects human body contact/non-contact on the electrodes E1 to E4 based on the capacitors Cx1 to Cx4 supplied from the measurement section 113 and the corresponding threshold values Cx1th to Cx4th respectively and adjusts the threshold values Cx1th to Cx4th based on the capacitors Cx1 to Cx4 respectively.

More specifically, the storage section 112a stores a predetermined number of immediately previous measurement results out of those of the capacitors Cx1 to Cx4. The reference value calculation section 112b obtains an average value of the predetermined number of immediately previous measurement results of the capacitors Cx1 to Cx4 stored in the storage section 112a as reference values Cx1ave through Cx4ave of the capacitors Cx1 to Cx4. The difference calculation section 112c obtains absolute difference values ΔCx1 through ΔCx4 between the reference values Cx1ave through Cx4ave and the electrostatic capacitance values Cx1 to Cx4 of the capacitors Cx1 to Cx4, which are the latest measurement results, respectively. The threshold value adjustment section 112d adjusts the threshold values Cx1th through Cx4th based on the absolute difference values ΔCx1 to ΔCx4 respectively.

Figure 28:
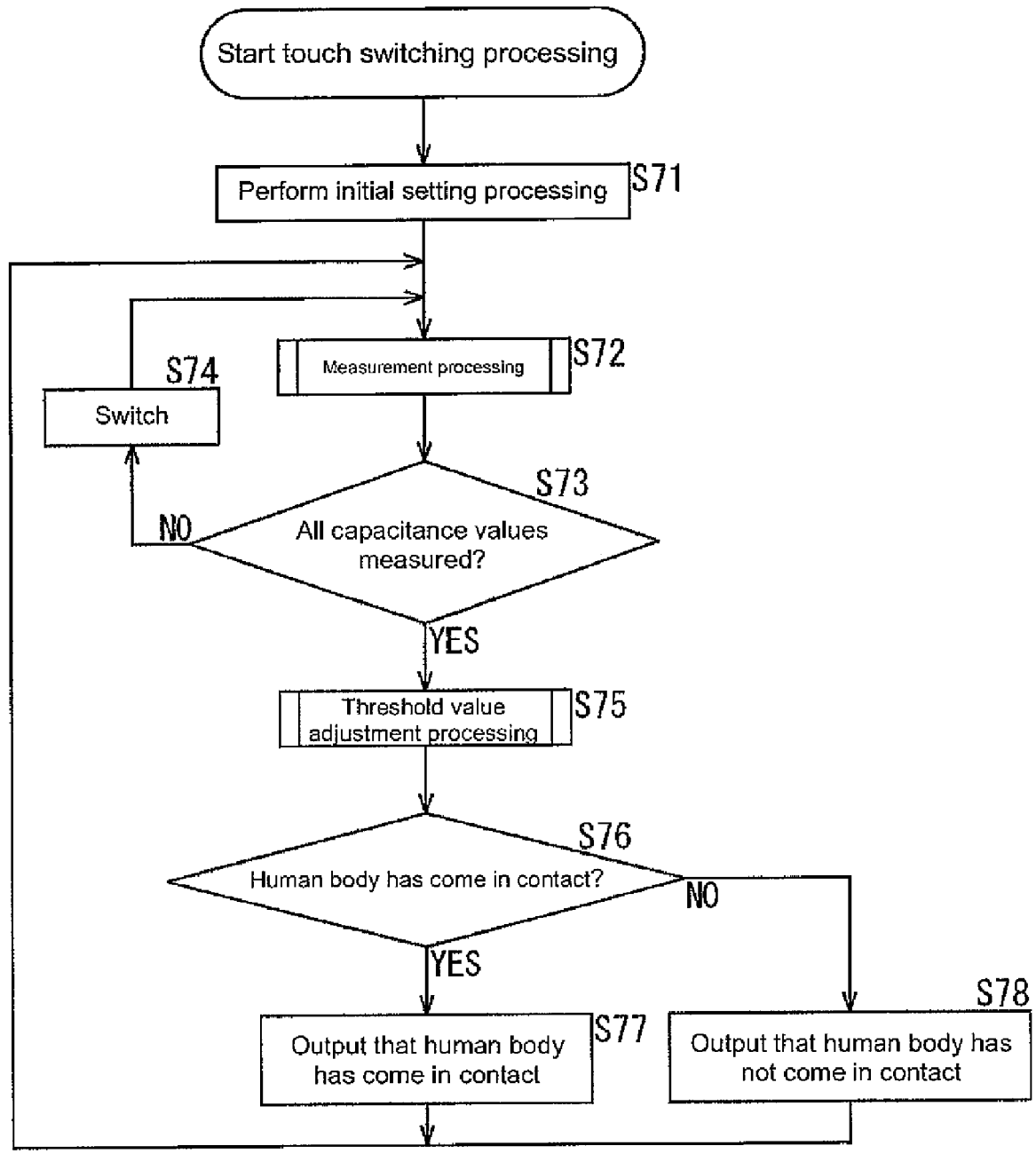
FIG. 28 shows an explanatory flowchart of touch switching processing by the touch sensor of FIG. 26.

Next, touch switching processing by the touch sensor of FIG. 26 will be described below with reference to the flowchart of FIG. 28. It is to be noted that processes of steps S71, S72, and S76 to S78 in the flowchart of FIG. 28 are similar to those of steps S1 to S5 in the flowchart of FIG. 4, and description thereof will not be given.

That is, if measurement processing for the capacitor Cx1, for example, is finished by the processing of step S72, the control section 112 determines in step S73 whether the measurement processing is finished for all of the capacitors Cx1 to Cx4, and if determines that the measurement processing has not been finished for all of them, controls the switching section 111 in step S74 to connect the switch section 101 to any one of terminals 101c to 101e, and the processing returns to step S72. That is, the switch section 101 is switched to the terminals 101b to 101e sequentially until electrostatic capacitance of each of the capacitors Cx1 to Cx4 is obtained through the measurement processing, thus repeating the processing of steps S72 to S74.

Then, when the measurement section 113 obtains electrostatic capacitance of each of the capacitors Cx1 to Cx4 and supplies the value to the control section 112 in step S73, threshold value adjustment processing is performed in step S75.

Figure 29:
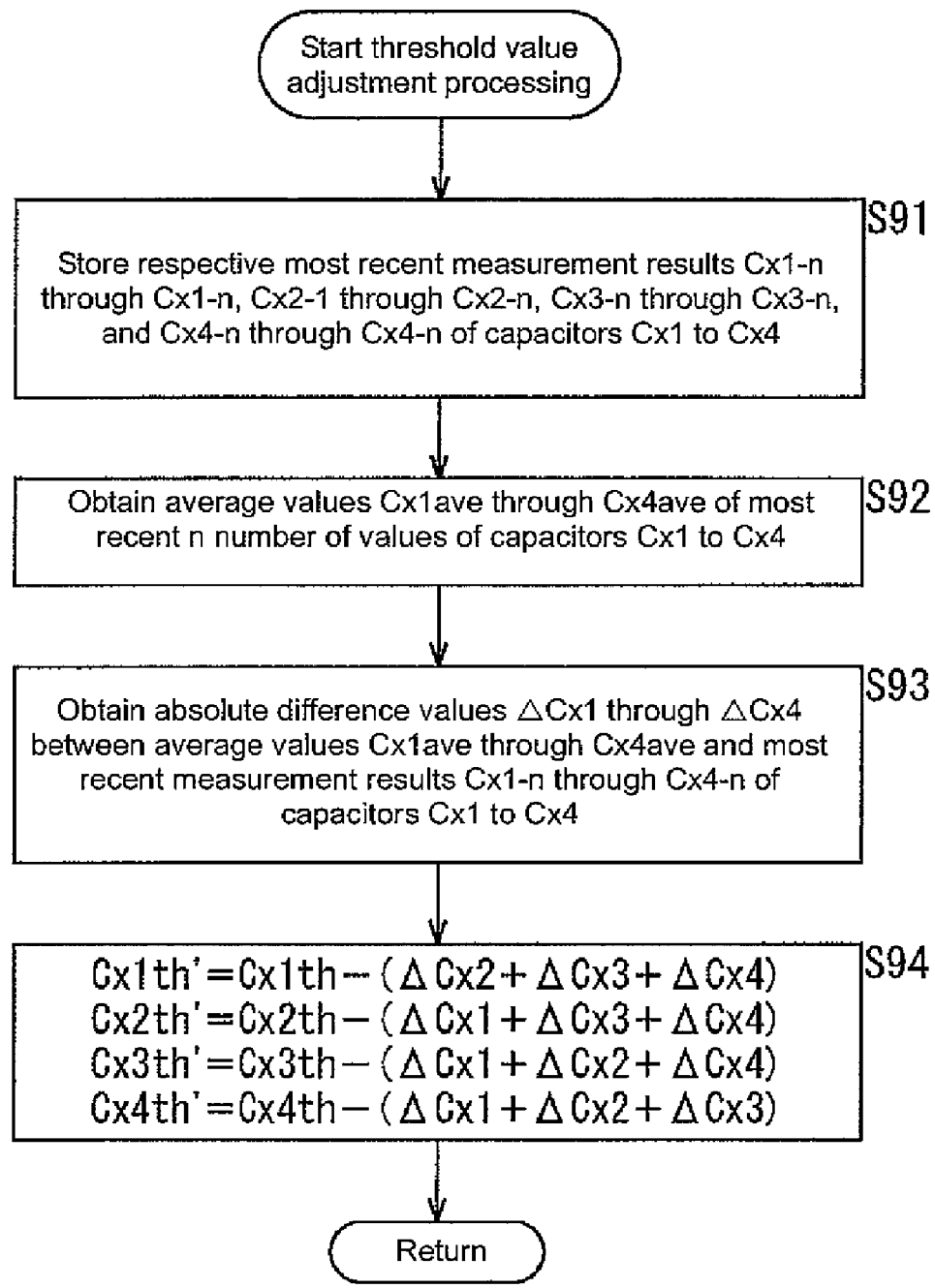
FIG. 29 shows an explanatory flowchart of measurement processing by the touch sensor of FIG. 26.

Now, the threshold value adjustment processing will be described below with reference to the flowchart of FIG. 29.

In step S91, the control section 112 adds to the storage section 112a the respective most recent measurement results Cx1-$n$ through Cx4-$n$ of the capacitors Cx1 to Cx4 supplied from the measurement section 113, so that, for example, n number of measurement results are stored as a predetermined number of immediately previous values. That is, the storage section 112a stores n number of immediately previous measurement results of Cx1-$n$ ... Cx1-1, Cx2-$n$ ... Cx2-1, Cx3-$n$ ... Cx3-1, Cx4-$n$ ... Cx4-1 are stored for each of the capacitors Cx1 to Cx4. It is to be noted that "-" is a sign to distinguish between electrostatic capacitance values, which are n number of measurement results, and the closer to n the value is, the more recent the measurement result is.

In step S92, the control section 112 controls the reference value calculation section 112b to calculate as a reference value an average value of n number of immediately previous measurement results of the capacitors Cx1 to Cx4. That is, the reference value calculation section 112b respectively obtains a reference value Cx1ave (=(Cx1-1)+(Cx1-2)+ ... +(Cx1-$n$))/n of electrostatic capacitance of the capacitor Cx1, a reference value Cx2ave (=(Cx2-1)+(Cx2-2)+ ... +(Cx2-$n$))/n of electrostatic capacitance of the capacitor Cx2, a reference value Cx3ave (=(Cx3-1)+(Cx3-2)+ ... +(Cx3-$n$))/n of electrostatic capacitance of the capacitor Cx1, and a reference value Cx4ave (=(Cx4-1)+(Cx4-2)+ ... +(Cx4-$n$))/n of electrostatic capacitance of the capacitor Cx4.

In step S93, the control section 112 controls the difference calculation section 112c to calculate absolute difference values between Cx1ave through Cx4ave of the capacitors Cx1 to Cx4 and the most recent measurement results (Cx1-$n$) through Cx4-$n$) respectively. That is, the difference calculation section 112c obtains absolute difference values ΔCx1 (=|(Cx1-$n$)−Cx1ave|), ΔCx2 (=|(Cx2-$n$)−Cx2ave|), ΔCx3 (=|(Cx3-$n$)−Cx3ave|), and ΔCx4 (=|(Cx4-$n$)−Cx4ave|) for the capacitors Cx1 to Cx4 respectively.

In step S94, the control section 112 controls the threshold value adjustment section 112d to adjust the threshold values Cx1th through Cx4th based on each of the absolute difference values. More specifically, the threshold value adjustment section 112d adjusts the threshold values Cx1th through Cx4th by calculating the following Equation (8):

$$Cx1th' = Cx1th - (\Delta Cx2 + \Delta Cx3 + \Delta Cx4)$$

$$Cx2th' = Cx2th - (\Delta Cx1 + \Delta Cx3 + \Delta Cx4)$$

$$Cx3th' = Cx3th - (\Delta Cx1 + \Delta Cx2 + \Delta Cx4)$$

$$Cx4th' = Cx4th - (\Delta Cx1 + \Delta Cx2 + \Delta Cx3) \qquad (8)$$

In this equation, Cx1th' through Cx4th' indicate post-adjustment threshold values, and Cx1th through Cx4th indicate pre-adjustment threshold values (i.e., threshold values in a case where simultaneous operations are not prohibited). That is, the threshold values Cx1th' through Cx4th' indicate threshold values that are adjusted with respect to the measurement results Cx1-$n$ through Cx4-$n$ of the n-th capacitors Cx1 through Cx4, and the threshold values Cx1th through Cx4th indicate the threshold values before the adjustment.

That is, if electrostatic capacitance values due to contact on other electrodes E1 to E4 are detected, the post-adjustment threshold values Cx1th' through Cx4th' are decreased from the pre-adjustment threshold values Cx1th through Cx4th by absolute difference values between the electrostatic capacitance values of the other electrodes and a reference value. Therefore, if electrostatic capacitance is detected on a plurality of electrodes, each of the electrodes has its threshold value decreased, so that sensitivity at which human body contact is sensed is lowered, whereby erroneous detection is reduced.

Through the above processing, in step S76, human body contact/non-contact on the electrodes E1 to E4 is sensed on the basis of measurement results of the capacitors Cx1 to Cx4 and the post-adjustment threshold values Cx1th' through Cx4th'.

That is, if, through the above adjustment of threshold values, for example, four electrodes E1 to E4 are disposed in a line close to one another and electrostatic capacitance of only one of those electrodes varies, the threshold value for the varied electrostatic capacitance itself does not change despite fluctuations in threshold values for the other electrostatic capacitance values, thereby determining contact/non-contact with ordinary sensitivity.

On the other hand, if a plurality of electrodes undergo variation in electrostatic capacitance simultaneously, as indicated by Equation (8), their threshold values are decreased and cannot easily exceeded by electrostatic capacitance caused by ordinary contact, so that it is difficult to determine the presence of human body contact, if any.

Further, if human body contact through ordinary contact is sensed on only one electrode and the corresponding capacitor Cx has electrostatic capacitance in the vicinity of a threshold value, its own threshold value does not change, so that even a change, if any, in electrostatic capacitance due to sensing of the human body contact will not affect the determination of contact/non-contact on that electrode. Therefore, it is possible that the electrodes E1 to E4 should all be difficult to sense human body contact only if, for example, water is spilled over all of the electrodes or they are under the influence of external noise, thus reducing erroneous detection only if erroneous detection is liable to occur. However, even in a condition where human body contact is difficult to be sensed, it can be sensed despite reduced sensitivity.

Accordingly, for example, in the case of a touch sensor equipped in a portable device, it is possible to prevent erroneous operation caused by the portable device's being put in a pocket so that a plurality of electrodes come in contact with any other metal in the pocket or by the plurality of electrodes of the touch sensor being placed on a metal desk and come in contact with it.

Further, for example, if a human body has touched only the electrode E1, only a measurement result of the capacitor Cx1 varies greatly with little variations in measurement result of the other capacitors the Cx2 to Cx4, so that the threshold value Cx1th' does not change with respect to the threshold value Cx1th. Therefore, it is possible to use initially set sensitivity (independently set sensitivity) to determine the presence of contact/non-contact of a human body based on a change in electrostatic capacitance of the capacitor Cx1 that corresponds to the electrode E1. In this case, the threshold values Cx2th' through Cx4th' of the capacitors the Cx2 to Cx4 other than the capacitor Cx1 decrease from the threshold values Cx2th through Cx4th by a difference $\Delta Cx1$ of the measurement value of the capacitance Cx1 respectively, so that when human body contact is sensed by the capacitor Cx1 previously, the other capacitors Cx2 to Cx4 have worse sensitivity for a human body to make it difficult to sense human body contact; therefore, proper contact on a target electrode can be detected properly while reducing erroneous detection when an electrode to be operated is contacted properly.

Further, if one electrode E1 is contacted by a human body, and while the contact state is maintained, any other electrode, for example, the electrode E2 is contacted, that is, if only the capacitor Cx1 has such electrostatic capacitance as in the case of human body contact, the capacitor Cx1 senses human body contact with ordinary sensitivity, but if in a condition where the capacitor Cx1 continues to sense human body contact, the other capacitors Cx2 to Cx4 have reduced sensitivity and are difficult to sense human body contact, if any, on the other electrodes E2-E4. Further, while human body contact is being sensed, the threshold value Cx1th' of the capacitor Cx1 corresponding to the electrode E1 is kept to the threshold value Cx1th' at the time of human body contact, so that even if the human body subsequently touches any other electrodes E2 to E4, the threshold value Cx1th' of the capacitor Cx1 does not change; therefore, unless contact on the electrode E1 is released, human body contact will be sensed properly based on an effect of measurement results of the capacitors Cx2 to Cx4 corresponding to the other electrodes E2 to E4.

Further, if at least two of the electrodes E1 to E4 are touched by a human body, all of the capacitors Cx1 to Cx4 are influenced by the respective differences $\Delta Cx1$ through $\Delta Cx4$ until the human body contact is sensed by all the capacitors Cx1 to Cx4, so that the threshold values Cx1th' through Cx4th' all become smaller than the threshold values Cx1th through Cx4th respectively. Therefore, the electrodes E1 to E4 all deteriorate in sensitivity for contact and are difficult to sense human body contact. That is, the threshold value Cx1th' of the capacitor Cx1 becomes smaller than the threshold value Cx1th by a sum of absolute difference values ($\Delta Cx2+\Delta Cx3+\Delta Cx4$) of the measurement values of the capacitors Cx2 to Cx4, so that the more electrodes are touched simultaneously, the more the thresholds change toward lowered sensitivity, thus making it difficult to sense human body contact. As a result, it is possible to reduce erroneous detection due to an effect that may occur when a touch sensor mounted in a portable device is placed on a metal desk, the portable device is put in a pocket so that its operation surface gets close to a human body, or water is spilled over the operation surface, besides simultaneous pressing of a plurality of electrodes owing to mistaken contact of a human being on an operation panel of the portable device.

Further, if one electrode E1 and another electrode E2 are touched in this order and then the finger on the first touched electrode E1 is released, the human body contact is not easily sensed for the later touched electrode E2 until the first electrode E1 no longer senses the human contact, but after contact on the electrode E1 out of both the electrodes E1 and 2 is released, $\Delta Cx1$ gradually decreases, and simultaneously, the threshold value Cx2th' of the capacitor Cx2 increases until electrostatic capacitance of the capacitor Cx2 exceeds the threshold value Cxth', whereupon the electrode E2 senses the human body contact. While the human body contact on the electrode E2 is being sensed after contact on the electrode E1 is released, the threshold value Cx1th' of the capacitor Cx1 has decreased, so that if the electrode E1 is contacted again, the human contact is not easily sensed for the electrode E1.

Further, if at least two electrodes are contacted and then the contact is released from all of the electrodes other than one electrode E1, the threshold value Cx1th' of the capacitor Cx1 returns to its original value, so that the electrode E1 senses human body contact when the threshold value Cx1th' of the capacitor Cx1 is exceeded, although none of the electrodes senses human body contact when they are touched simultaneously.

It is to be noted that in the above-described example of preventing erroneous detection of human body contact owing to lowered sensitivity in the case of simultaneous contact at two positions or more, the sensitivity is only lowered and the detection of human body contact is not completely disabled, so that if a plurality of electrodes are touched simultaneously, the electrodes all may possibly sense the human body contact. In a case of a plurality of electrodes sensing contact in such a manner, a priority of the electrodes may be set beforehand, so that if the electrodes sense human body contact, the human body contact can be sensed using the electrode having higher priority.

Further, if electrodes have different levels of sensitivity physically, a ratio between absolute difference values may be obtained to multiply a threshold value by that ratio for adjustment, thereby reducing the difference in sensitivity by, for example, at most twice.

Further, in the case of an application program that has also a mode in which operations are recognized when a plurality of electrodes sense contact simultaneously, it may be so arranged that the plurality of electrodes sense contact.

It is to be noted that although the above-described example measures human body contact/non-contact by obtaining unknown electrostatic capacitance of capacitor Cx, the present invention may be applied to any other measurement apparatuses as long as contact/non-contact can be measured on the basis of a change in electrostatic capacitance; for example, such a pressure sensor may be constituted as to measure pressure by measuring electrostatic capacitance by providing a configuration that the electrostatic capacitance may change as a distance between electrodes changes in accordance with pressure.

It is thus possible to speedily measure unknown electrostatic capacitance with high accuracy by using an inexpensive apparatus and also speedily determine human body contact/non-contact accurately based on measurement results of the electrostatic capacitance.

Further, the above-described series of processing can be performed also by software as well as by hardware. In the case of performing the series of processing by software, programs of the software are installed from a recording medium into a computer incorporated into dedicated hardware or, for example, a general purpose personal computer capable of performing various functions when various programs are installed in it.

Figure 30:
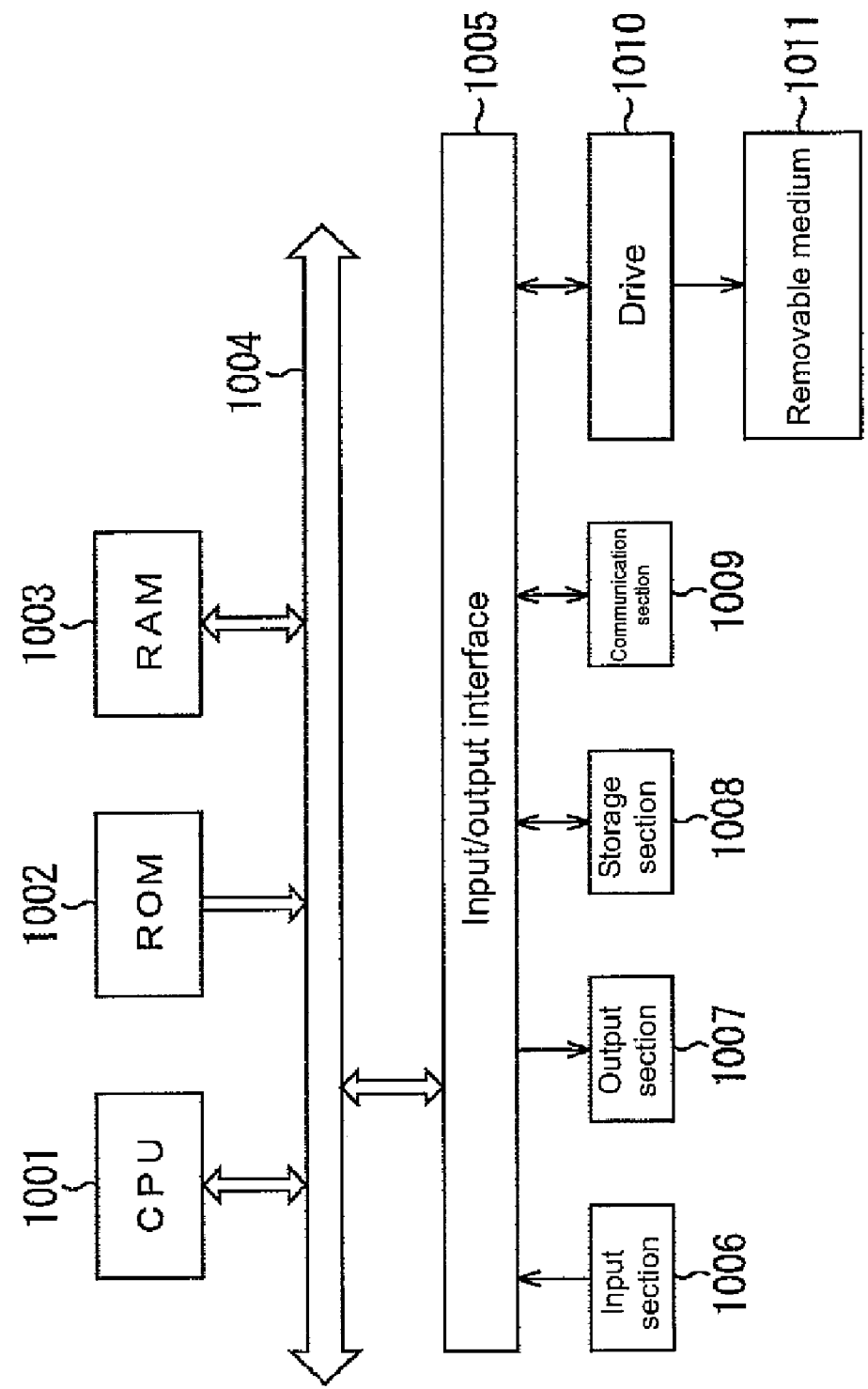
FIG. 30 shows an explanatory diagram of a constitution of a general purpose personal computer.

FIG. 30 shows a constitution of one embodiment of a personal computer in a case where software is used to realize internal electrical configurations of the microcomputers 1, 21, 51, 61, 71, 81, and 91 of FIGS. 1, 14, 19, 21, 22, 25, and 26 respectively. A CPU 1001 of the personal computer controls the overall operations of the personal computer. When a command is inputted by a user from an input section 1006 such as a keyboard or a mouse through a bus 1004 and an input/output interface 1005, the CPU 1001 executes the corresponding program stored in a read only memory (ROM) 1002. Alternatively, the CPU 1001 loads into a random access memory (RAM) 1003 and executes a program read from a removable medium 1011, such as a magnetic disk, an optical disk, a magneto-optical disk, or a semiconductor memory connected to a drive 1010 and installed in a storage section 1008. In such a manner, the respective functions of the above-described microcomputers 1, 21, 51, 61, 71, 81, and 91 of FIGS. 1, 14, 19, 21, 22, 25, and 26 are realized by software. Further, the CPU 1001 controls a communication section 1009 to communicate with the outside, thereby receiving and transmitting data.

As shown in FIG. 30, a recording medium in which the programs are recorded is not only constituted of the removable medium 1011 such as a magnetic disk (including a flexible disk), an optical disk (including a compact disk-read only memory (CD-ROM) and a digital versatile disk (DVD)), a magneto-optical disk (including a mini-disc (MD)), or a semiconductor memory storing the programs that is distributed in order to provide the programs to the user independently of the computer, but also constituted of a ROM 1002 or a hard disk in the storage section 1008 which stores the programs and provided to the user in a condition where it is incorporated in the computer beforehand.

It is to be noted that the steps describing a program recorded in a recording medium and performed in a time sequence in the described order in the present specification may of course include, besides time-sequential processes, concurrently or individually performed processes.

What is claimed is:

1. A sensing apparatus comprising:
   a measurement section that measures capacitance of each of a plurality of first electric capacitors having unknown capacitance;
   a plurality of contact sections that are electrically connected to the plurality of first electric capacitors and that a human body disposed proximally contacts directly or indirectly through an insulator;
   a determination section that determines whether the human body has contacted the contact section either directly or indirectly based on a result of comparison between the capacitance of the plurality of first electric capacitors measured by the measurement section and a threshold value for each of the plurality of first electric capacitors;
   a storage section that cumulatively stores a result of measurement for each of the plurality of first electric capacitors, the result of measurement being the result of measurement by the measurement section;
   a reference capacitance calculation section that calculates reference capacitance for each of the plurality of first electric capacitors based on the result of measurement stored in the storage section;
   a difference calculation section that calculates an absolute difference value between the reference capacitance for each of the plurality of first electric capacitors and the result of measurement measured by the measurement section for each of the plurality of first electric capacitors; and
   an adjustment section that adjusts the threshold value for each of the plurality of first electric capacitors based on a sum of the absolute difference value of the other first electric capacitors in the plurality of first electric capacitors calculated by the difference calculation section.

2. The sensing apparatus according to claim 1, further comprising:
   a third electric capacitor whose first end is connected to a second end of a circuit whose first end is grounded and which connects in series a second electric capacitor having known capacitance with the first electric capacitors and whose second end is grounded, to apply a charging voltage of the third electric capacitor itself to the second end of the circuit, so as to charge the first electric capacitors and a plurality of second electric capacitors identical to the second electric capacitor having the known capacitance and respectively corresponding to the first electric capacitors;
   a first discharge section that discharges the third electric capacitor partly and the second electric capacitor totally;
   a second discharge section that discharges the first electric capacitors totally at substantially the same timing as the first discharge section;
   a counter section that measures the number of times of discharging by the first discharge section and the second discharge section; and
   a comparison section that compares a charging voltage for the first electric capacitors and a reference voltage,
   wherein in a case where discharging is repeated by the first and second discharge sections and when a result of comparison by the comparison section indicates that the charging voltage for the first electric capacitors agrees with the reference voltage or smaller than the reference voltage, the measurement section calculates the capacitance of the first electric capacitors based on the current number of times of discharging measured by the counter section, thereby measuring the capacitance of the first electric capacitors.

3. The sensing apparatus according to claim 2, wherein the first discharge section discharges the third electric capacitor which has been charged for a predetermined time through a resistor connected in series with the third electric capacitor, to discharge the third electric capacitor partly.

4. The sensing apparatus according to claim 3, further comprising a charge section that charges the third electric capacitor at a predetermined charging voltage, wherein the charge section charges the third electric capacitor directly.

5. The sensing apparatus according to claim 3, further comprising a charge section that charges the third electric capacitor at a predetermined charging voltage,
   wherein the first discharge section has a first end thereof grounded and a second end thereof connected between the circuit and the resistor, and
   the charge section charges the third electric capacitor from the same position as the second end of the first discharge section.

6. The sensing apparatus according to claim 5, further comprising a diode in parallel with the resistor and in a forward direction toward the third electric capacitor.

7. The sensing apparatus according to claim 2, further comprising a switch section that switches one of the second electric capacitors having the known capacitance and the plurality of first electric capacitors to connect them in series.

8. The sensing apparatus according to claim 2,
   wherein the second electric capacitor further includes an electrode, and the electrode is contacted by a human body directly or indirectly through an insulator.

9. The sensing apparatus according to claim 1, wherein the adjustment section adjusts the threshold value by subtracting from the threshold value for each of the first electric capacitors a value of the sum of the absolute difference value calculated by the difference calculation section for each of the plurality of first electric capacitors other than the absolute difference value of each of the first electric capacitors.

10. A sensing method comprising:
   a measurement step of measuring capacitance of each of a plurality of first electric capacitors having unknown capacitance;
   a determination step of determining whether a human body has contacted a contact section either directly or indirectly based on a result of comparison between the capacitance of the plurality of first electric capacitors measured by a measurement section and a threshold value for each of the plurality of first electric capacitors;
   a storage step of cumulatively storing a result of measurement for each of the plurality of first electric capacitors, the result of measurement being the result of measurement through processing of the measurement step;
   a reference capacitance calculation step of calculating reference capacitance for each of the plurality of first electric capacitors based on the result of measurement stored through processing of the storage step;
   a difference calculation step of calculating an absolute difference value between the reference capacitance for each of the plurality of first electric capacitors and the result of measurement measured through processing of the measurement step for each of the plurality of first electric capacitors; and
   an adjustment step of adjusting the threshold value for each of the plurality of first electric capacitors based on a sum of the absolute difference value of the other first electric capacitors in the plurality of first electric capacitors calculated through processing of the difference calculation step.

11. A non-transitory computer readable medium that causes a computer to perform a method, comprising:
   a measurement step of measuring capacitance of each of a plurality of first electric capacitors having unknown capacitance;
   a determination step of determining whether a human body has contacted a contact section either directly or indirectly based on a result of comparison between the capacitance of the plurality of first electric capacitors measured by a measurement section and a threshold value for each of the plurality of first electric capacitors;
   a storage step of cumulatively storing a result of measurement for each of the plurality of first electric capacitors, the result of measurement being the result of measurement through processing of the measurement step;
   a reference capacitance calculation step of calculating reference capacitance for each of the plurality of first electric capacitors based on the result of measurement stored through processing of the storage step;
   a difference calculation step of calculating an absolute difference value between the reference capacitance for each of the plurality of first electric capacitors and the result of measurement measured through processing of the measurement step for each of the plurality of first electric capacitors; and
   an adjustment step of adjusting the threshold value for each of the plurality of first electric capacitors based on a sum of the absolute difference value of the other first electric capacitors in the plurality of first electric capacitors calculated through processing of the difference calculation step.

* * * * *